(12) United States Patent
Joo et al.

(10) Patent No.: US 11,488,923 B2
(45) Date of Patent: Nov. 1, 2022

(54) HIGH RELIABILITY SEMICONDUCTOR DEVICES AND METHODS OF FABRICATING THE SAME

(71) Applicant: Cree, Inc., Durham, NC (US)

(72) Inventors: Sung Chul Joo, Cary, NC (US); Alexander Komposch, Morgan Hill, CA (US); Brian William Condie, Gilroy, CA (US); Benjamin Law, Fremont, CA (US); Jae Hyung Jeremiah Park, Apex, NC (US)

(73) Assignee: WOLFSPEED, INC., Durham, NC (US)

( * ) Notice: Subject to any disclaimer, the term of this patent is extended or adjusted under 35 U.S.C. 154(b) by 552 days.

(21) Appl. No.: 16/421,824

(22) Filed: May 24, 2019

(65) Prior Publication Data

US 2020/0373270 A1 Nov. 26, 2020

(51) Int. Cl.
*H01L 23/00* (2006.01)

(52) U.S. Cl.
CPC .............. *H01L 24/32* (2013.01); *H01L 24/29* (2013.01); *H01L 2224/29012* (2013.01); *H01L 2224/29144* (2013.01); *H01L 2224/3207* (2013.01); *H01L 2224/32052* (2013.01); *H01L 2224/32245* (2013.01); *H01L 2924/1033* (2013.01); *H01L 2924/10156* (2013.01);
(Continued)

(58) Field of Classification Search
CPC ...................... H01L 24/32; H01L 24/29; H01L 2224/29012; H01L 2924/10156; H01L 2924/35121; H01L 2224/3207; H01L 2224/32052; H01L 2924/10253; H01L 2924/10272; H01L 2924/10254; H01L 2224/29144; H01L 2924/1033; H01L 2224/32245; H01L 2924/13064; H01L 2924/13091; H01L 24/83; H01L 2224/32014; H01L 2924/10161; H01L 2924/12032; H01L 2924/1304; H01L 2224/83101; H01L 2224/29339; H01L 2224/29347; H01L 2224/8384; H01L 2224/83801; H01L 2224/8385; H01L 2224/2919; H01L 2224/03848; H01L 2224/0383; H01L 24/03; H01L 2224/04026; H01L 2224/05644; H01L 2224/05552; H01L 2224/05555; H01L 24/05; H01L 23/49503
See application file for complete search history.

(56) References Cited

U.S. PATENT DOCUMENTS 6,169,322 B1 * 1/2001 Chang ............... H01L 23/49503
257/655
7,042,103 B2 5/2006 Condie et al.
(Continued)

*Primary Examiner* — Selim U Ahmed
(74) *Attorney, Agent, or Firm* — Myers Bigel, P.A.

(57) ABSTRACT

A semiconductor device package includes a substrate, a silicon (Si) or silicon carbide (SiC) semiconductor die, and a metal layer on a surface of the semiconductor die. The metal layer includes a bonding surface that is attached to a surface of the substrate by a die attach material. The bonding surface includes opposing edges that extend along a perimeter of the semiconductor die, and one or more non-orthogonal corners that are configured to reduce stress at an interface between the bonding surface and the die attach material. Related devices and fabrication methods are also discussed.

33 Claims, 18 Drawing Sheets

(52) U.S. Cl.
CPC .............. *H01L 2924/10253* (2013.01); *H01L 2924/10254* (2013.01); *H01L 2924/10272* (2013.01); *H01L 2924/13064* (2013.01); *H01L 2924/13091* (2013.01); *H01L 2924/35121* (2013.01)

(56) References Cited

U.S. PATENT DOCUMENTS

| | | |
|---|---|---|
| 7,332,414 B2 | 2/2008 | Condie et al. |
| 2009/0278244 A1* | 11/2009 | Dunne .................. H01L 23/481 257/676 |
| 2018/0204786 A1* | 7/2018 | Rodriguez .......... H01L 21/3065 |

* cited by examiner

HIGH RELIABILITY SEMICONDUCTOR DEVICES AND METHODS OF FABRICATING THE SAME

FIELD

The present disclosure is directed to semiconductor devices, and more particularly, to semiconductor die attachment and related fabrication methods.

BACKGROUND

Die attach may refer to operations that result in electrical connection between a semiconductor device die and a packaging substrate. Semiconductor die attach operations typically occur after the dicing or sawing of a semiconductor wafer into individual die. Some die attach operations may involve the attachment of a semiconductor die to a packaging substrate by way of a die attach material (e.g., gold-tin (AuSn)) at a metal die pad, to produce a packaged die.

A packaged die is typically subjected to heating during its manufacture. For example, during solder-based die attach, the die and the die pad are typically subjected to temperatures that are sufficiently high (e.g., greater than about 220° C.) to effect solder reflow. Similarly high temperatures may also be encountered in sintering-based die attach operations (e.g., using nano-silver or nano-copper bond materials at temperatures of about 150° C. or more) and adhesive die attach operations, as well as in temperature-based testing.

In particular, some packaged radio frequency (RF) devices are required to pass thermal shock and/or temperature cycle testing (e.g., for hundreds of cycles and/or at temperatures ranging from about −65° C. to about 150° C. or more, in some instances up to about 500° C.). Such temperatures can result in thermally induced stresses in the die. For example, some Thermally Enhanced Package (TE-PAC) substrates may have sufficient reliability to pass 500 cycles of thermal shock and/or temperature cycle testing. However, some RF devices may fail at later cycles of testing (e.g., greater than 500 cycles). Failure modes in die attachment may include (but are not limited to) cracking and/or chipping of the die, as well as delamination between the die and the substrate bond area.

SUMMARY

According to some embodiments described herein, a semiconductor device includes a substrate, a semiconductor die, and a metal layer on a surface of the semiconductor die. The semiconductor die includes silicon (Si) or silicon carbide (SiC) or diamond. The metal layer includes a bonding surface that is attached to a surface of the substrate, for example, by a die attach material. The bonding surface includes opposing edges that extend along a perimeter of the semiconductor die, and one or more non-orthogonal corners. The non-orthogonal corners may be shaped or otherwise configured to reduce stress at an interface between the bonding surface and the die attach material.

In some embodiments, the one or more non-orthogonal corners may include radiused or chamfered corners. For example, the radiused or chamfered corners may have a radius of curvature or chamfer dimension, respectively, of about 100 microns or more.

In some embodiments, the opposing edges of the bonding surface may extend along the perimeter of the semiconductor die at a distance of less than 25 microns therefrom.

In some embodiments, the bonding surface may be attached to the surface of the substrate by a die attach material. The one or more non-orthogonal corners may be configured to reduce stress at an interface between the bonding surface and the die attach material.

In some embodiments, an elastic modulus of the semiconductor die may be greater than that of the die attach material by about 1.5 times or more.

In some embodiments, a thickness of the semiconductor die may be less than about 100 microns, a thickness of the metal layer may be less than about 10 microns, and a thickness of the die attach material may be less than the thickness of metal layer.

In some embodiments, the metal layer and/or the die attach material may include gold (Au) or an alloy thereof. The surface of the substrate may be a die attach pad including copper (Cu) or an alloy thereof or a metal-matrix composite thereof.

In some embodiments, the surface of the semiconductor die including the metal layer thereon may have radiused or chamfered corners that are aligned with the radiused or chamfered corners of the bonding surface.

In some embodiments, opposing edges and the radiused or chamfered corners of the semiconductor die may include laser-ablated edges and corners, respectively.

According to some embodiments described herein, a semiconductor device package includes a substrate, a die, and a metal layer on a surface of the die. The die includes a semiconductor material having an elastic modulus of greater than 100 gigapascals (GPa). The metal layer includes a bonding surface that is attached to a surface of the substrate for example, by a die attach material. The bonding surface includes opposing edges that extend along a perimeter of the die and one or more radiused or chamfered corners. The radiused or chamfered corners may be configured to reduce stress at an interface between the bonding surface and the die attach material.

In some embodiments, the one or more radiused or chamfered corners may have a radius of curvature or chamfer dimension, respectively, of about 100 microns or more.

In some embodiments, the opposing edges of the bonding surface may extend along the perimeter of the die at a distance of less than 25 microns therefrom.

In some embodiments, the bonding surface may be attached to the surface of the substrate by a die attach material. The one or more radiused or chamfered corners may be configured to reduce stress at an interface between the bonding surface and the die attach material.

In some embodiments, an elastic modulus of the semiconductor material may be greater than that of the die attach material by about 1.5 times or more.

In some embodiments, the semiconductor material may be silicon (Si), silicon carbide (SiC), gallium nitride (GaN), or any other suitable material. The die may include Si or silicon carbide (SiC). The metal layer and/or the die attach material may include gold (Au) or an alloy thereof. The surface of the substrate may be a die attach pad including copper (Cu) or an alloy thereof or a metal-matrix composite thereof.

In some embodiments, the surface of the die including the metal layer thereon may have radiused or chamfered corners that are aligned with the radiused or chamfered corners of the bonding surface. For example, opposing edges and the radiused or chamfered corners of the die comprise laser-ablated edges and corners, respectively.

According to some embodiments described herein, a semiconductor device package includes a substrate, a die, and a metal layer on a surface of the die. The die includes a semiconductor material. The metal layer includes a bonding surface having radiused or chamfered corners, and is attached to a surface of the substrate by a die attach material. An elastic modulus of the semiconductor material is greater that of the die attach material by about 1.5 times or more. The radiused or chamfered corners may be configured to reduce stress at an interface between the bonding surface and the die attach material.

In some embodiments, the bonding surface may have opposing edges that extend along a perimeter of the die at a distance of less than 25 microns therefrom.

In some embodiments, the radiused or chamfered corners may have a radius of curvature or chamfer dimension, respectively, of about 100 microns or more.

In some embodiments, the surface of the die including the metal layer thereon may have laser-ablated radiused or chamfered corners that are aligned with the radiused or chamfered corners of the bonding surface.

According to some embodiments described herein, a semiconductor device package includes a substrate and a die attached to a surface of the substrate. The die includes a material having an elastic modulus of greater than 100 gigapascals (GPa). A surface of the die adjacent the surface of the substrate includes radiused or chamfered corners. In some embodiments, the material may be silicon (Si), silicon carbide (SiC), or diamond, and the corners may be laser-ablated. The semiconductor device package may further include metal layer on the surface of the die, defining a bonding surface having radiused or chamfered corners that are aligned with the radiused or chamfered corners of the surface of the die.

According to some embodiments described herein, a method of fabricating a semiconductor device includes singulating a semiconductor die from a semiconductor wafer using a laser ablation process to define a surface of the semiconductor die having radiused or chamfered corners. The radiused or chamfered corners of the die and opposing edges therebetween thus include laser-ablated corners and edges, respectively.

In some embodiments, the die may include a metal layer on the surface of the die. A bonding surface defined by the metal layer may have a shape that is aligned with or otherwise corresponds to the shape of the surface of the die.

In some embodiments, singulating the semiconductor die from the semiconductor wafer using the laser ablation process may include a greater duration of lasing at one or more corners of the die to form the radiused or chamfered corners. The radiused or chamfered corners may have a radius of curvature or a chamfer dimension of 100 microns or more, 200 microns or more, or 300 microns or more.

In some embodiments, the bonding surface may extend from one of the opposing edges to the other.

In some embodiments, the metal layer may be a backside metallization layer that defines a contact area between the die and a package substrate.

According to some embodiments described herein, a method of fabricating a semiconductor device includes forming a metal layer on a semiconductor wafer, and patterning the metal layer to define respective bonding surfaces on portions of the wafer corresponding to respective semiconductor dies, such that scribe lines or streets of the wafer between adjacent dies on the wafer are free of the metal layer or have a reduced thickness of the metal layer thereon relative to the portions of the wafer corresponding to the respective semiconductor dies.

In some embodiments, the metal layer may be deposited by forming a mask on the scribe lines or streets of the wafer, and performing a sputtering or plating process to selectively deposit the metal layer on areas of the wafer that are exposed by the mask such that the scribe lines or streets of the wafer are free of the metal layer. The respective semiconductor dies may be diced from the wafer using a mechanical dicing process along the scribe lines or streets that are free of the metal layer.

In some embodiments, a respective one of the semiconductor dies may include the respective bonding surface having opposing edges that extend along the perimeter of the semiconductor die at a distance of less than 25 microns therefrom.

In some embodiments, the respective bonding surfaces may include one or more non-orthogonal corners, such as radiused or chamfered corners.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Figure 13A:
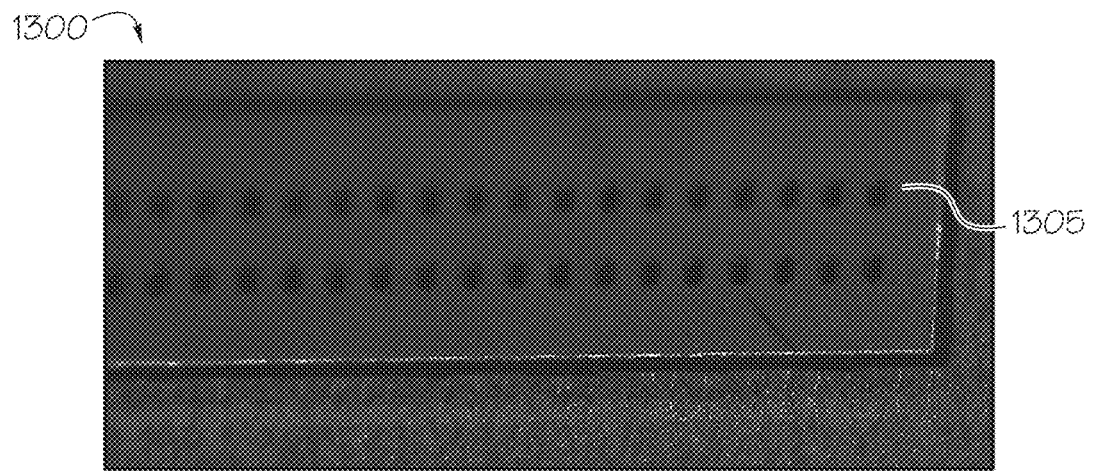
FIGS. 13A and 13B are inverted plan and cross-sectional views, respectively, of some conventional die attachment operations and structures.
Figure 13B:
Figure 13C:
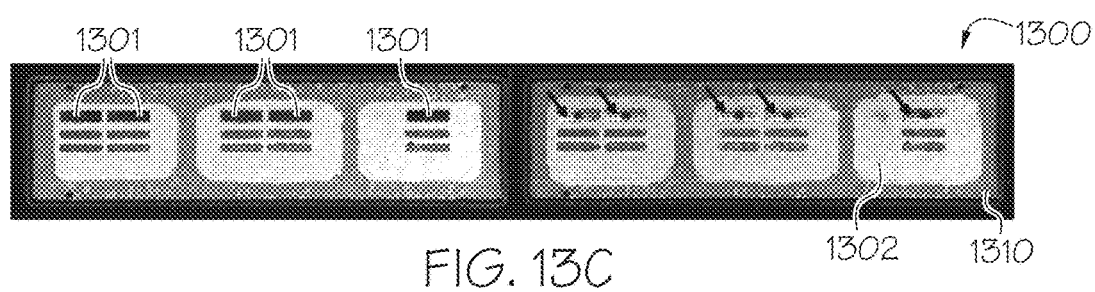
FIGS. 13C and 13D are views illustrating delamination of some conventional dies from die attach regions.
Figure 13D:
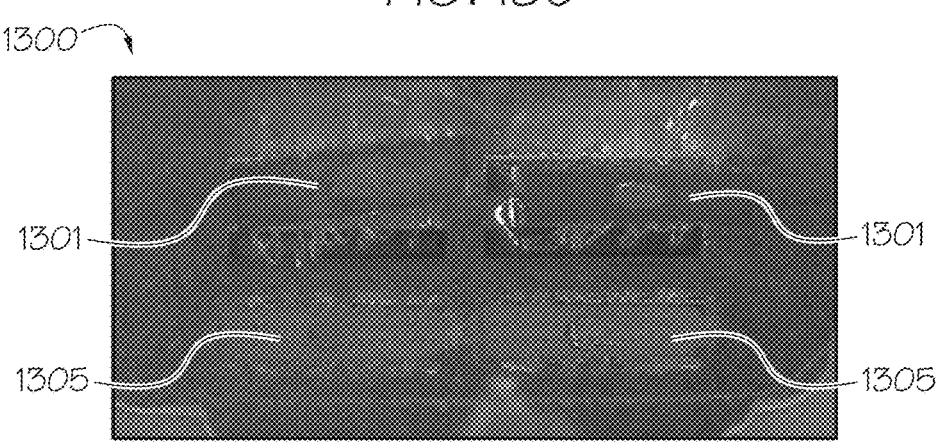

One failure mode in die attachment of RF devices is delamination between the die and the substrate bond area. For example, FIG. 13A is an inverted plan view (illustrating an underside) and FIG. 13B is a cross-sectional view of a conventional RF semiconductor device package 1300 including a die 1301 having a backside metal layer 1305 that is attached to a die attach region or flange 1302 of a package substrate 1310 by a die attach material 1315. As shown in FIG. 13B, the die 1301 can delaminate from the die attach region 1302 of the substrate 1310 in the bond area. The bond area may include one or more of the layers or interfaces between the die 1301 and the substrate 1310, such as the backside metal layer 1305, the die attach material 1315, and/or the die attach region 1302. FIGS. 13C and 13D are views of the package 1300 illustrating delamination of multiple dies 1301 from die attach regions 1302. In particular, FIG. 13C is an acoustic microscopy image illustrating the package 1300 before (left side) and after (right side) temperature shock. FIG. 13D illustrates post-temperature shock and die shear with bottom/backside metal layer 1305 of the die 1301 being shown.

A root cause of such delamination may be stress concentration in the bond area. Differences in Coefficients of Thermal Expansion (CTEs) between the substrate materials, the die materials, and/or the bonding materials can contribute to different levels of stress. CTEs described herein are in units of micrometers per meter per degree Celsius)(μm/m/ C°). CTE stress may involve multiple factors, including but not limited to die size, die attach temperature, curing temperature, and size/flatness/thickness of the die attach pad or surface on the package substrate relative to die size and the shape of the die attach fillet at edges of the die. While, stress can be alleviated by selecting material combinations with more compatible CTEs, this may come at a price of lower thermal performance due to the typically low thermal conductivity of such materials. Moreover, such an approach limits the use of metals such as copper for the die attach pad or surface of the package substrate, which may be otherwise advantageous due to the higher thermal conductivities and lower cost of these metals.

Figure 14A:
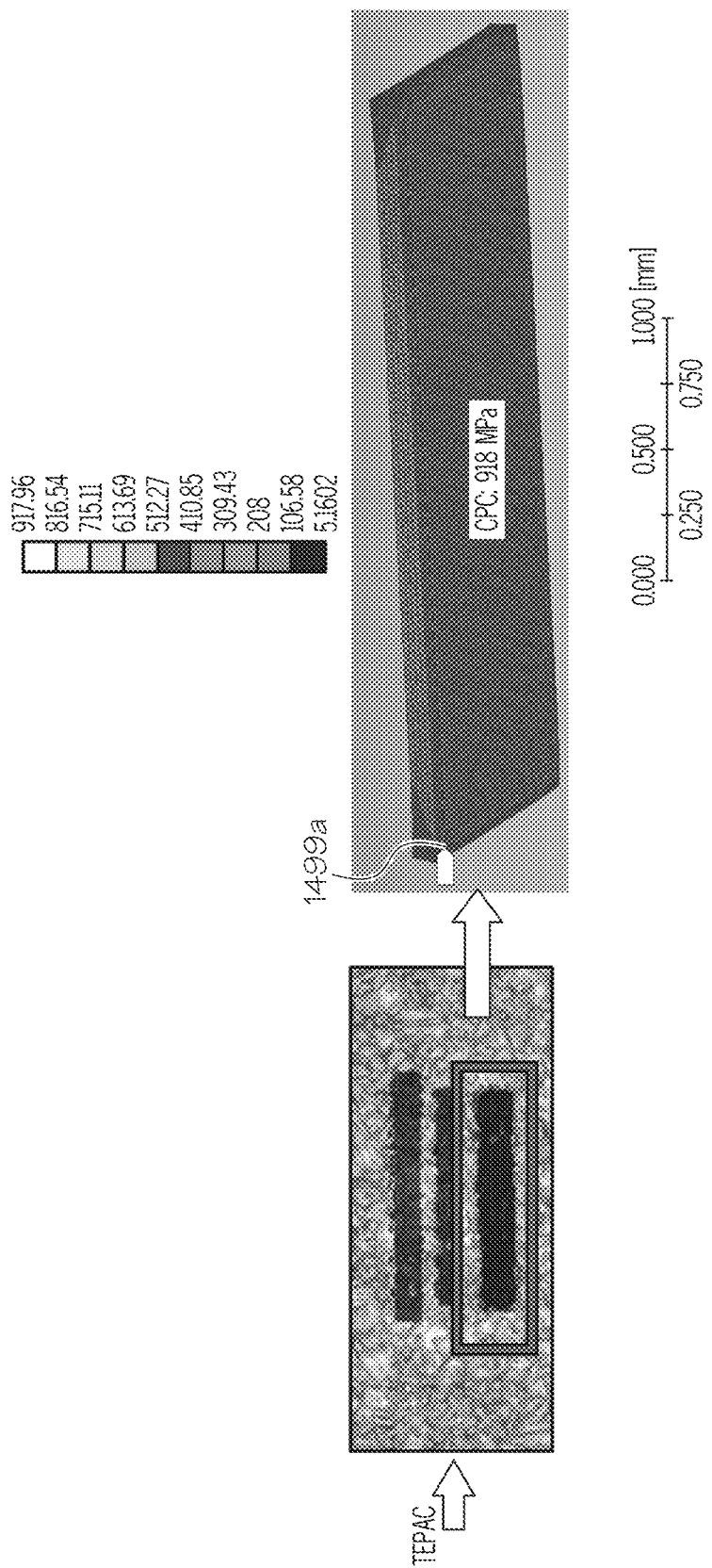
FIGS. 14A, 14B, and 14C illustrate differences in stress profiles in the bond area for three different die attach pad or flange regions of a substrate.
Figure 14B:
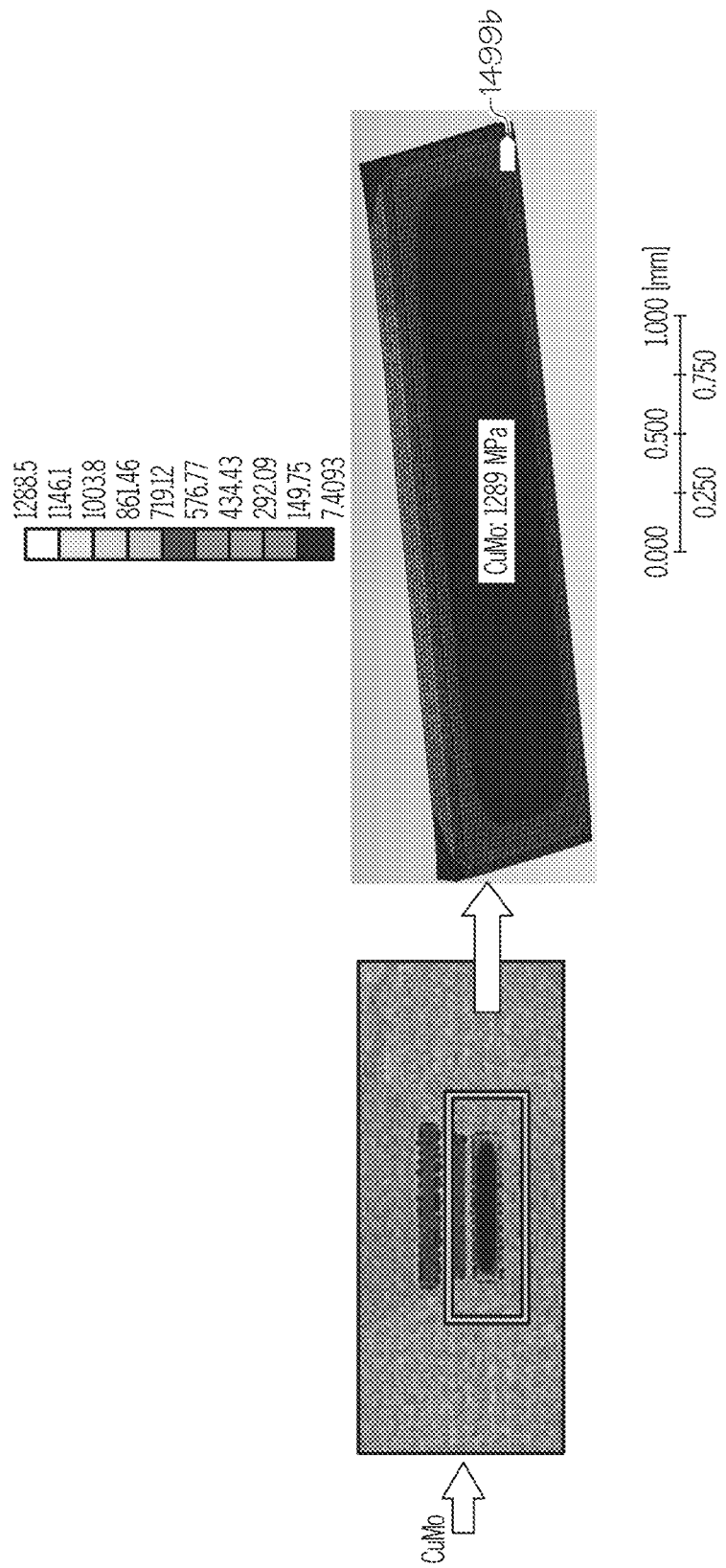
Figure 14C:
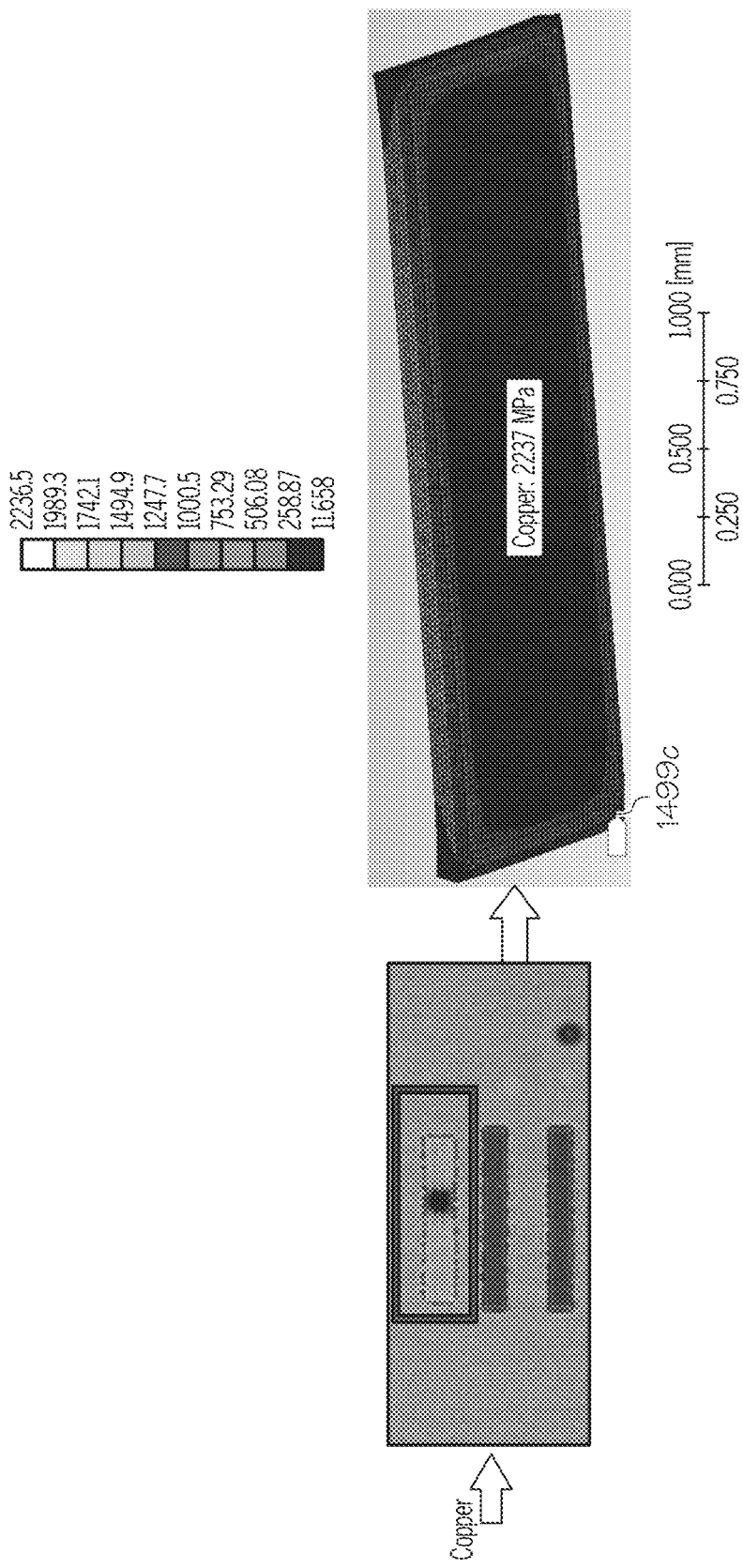

For example, FIGS. 14A, 14B, and 14C illustrate differences in stress profiles in the bond area for three different die attach pad or flange regions of a substrate. These profiles were obtained from thermal stress simulations modeled for a 100 micron-thick silicon carbide (SiC) die coated with 6 micron gold (Au) as the backside metallization and having a 3 micron-thick layer of AuSn solder as the die attach material, with flanges or die attach pad surfaces of TEPAC (FIG. 14A), copper-molybdenum (FIG. 14B), and other copper alloy (FIG. 14C). As shown in the stress profiles of FIGS. 14A, 14B, and 14C, the copper alloy flange material exhibited the greatest stress (in megapascals (MPa)) in the bond area, while the TEPAC flange material having the least stress. With all three flange materials, stress was concentrated at respective corners 1499a, 1499b, and 1499c of the bond area.

Some embodiments described herein may arise from realization that, in die attachment to a substrate, amounts and types of stress between the die and the substrate can greatly vary depending on the types of materials of the die, the substrate, and the die attachment or bond area therebetween. In particular, materials having a higher stiffness or resistance to deformation (indicated, for example, by a high elastic modulus) can introduce greater stress in the bond area than some other materials with lower resistance to deformation, which may have greater stress in the die or die attach pad. As described herein, the bond area may include the metal layer on a surface (e.g. a backside) of the die, the die attach material, and/or the die attach pad or flange material of the package substrate.

For example, in some conventional die attach methods, such as with GaAs dies, the die itself may be the weakest element among the die, the substrate, and the bonding material. In particular, GaAs may have a stiffness or deformation resistance defined by an elastic modulus of about 85.5 gigapascals (GPa) at a typical thickness of about 25 microns. Thus, differences in CTE between the GaAs die and the package substrate may result in cracking or chipping of the GaAs die. The elastic modulus described herein may refer to Young's modulus (E), and may describe tensile elasticity, or the tendency of an object to deform along an axis when opposing forces are applied along that axis (e.g., the ratio of tensile stress to tensile strain). Elastic modulus may be described herein in units of Pascals (Pa).

Some conventional methods of addressing such die cracking or chipping may include avoiding bonding along a perimeter of the die (where the die may be weaker, for example, from dicing operations), thereby shifting the stress maxima to an area closer to the center of the die, where the die may be stronger (in some instances, by an order of magnitude). A die attach material (such as AuSn solder) may be used, with a thickness of about 10 to 20 microns.

In contrast, some embodiments of the present invention are directed to higher-elastic modulus semiconductor die materials, such as silicon carbide (SiC), silicon (Si), diamond, and/or gallium nitride (GaN)-based dies, which may have a stiffness or deformation resistance that is defined by an elastic modulus of about 100 GPa or more (e.g., 200 GPa or more, 300 GPa or more, 400 GPa or more, or even 1000 GPa or more). For example, a SiC-based die in accordance with embodiments described herein may have an elastic modulus of about 410 GPa. Likewise, a Si-based die may have an elastic modulus of about 112 GPa, and a GaN-based die may have an elastic modulus of about 295 GPa, and a diamond-based die may have an elastic modulus of about 1050 GPa. Although described herein primarily with reference to Si and SiC die materials, embodiments described herein may utilize other suitable high-elastic modulus (e.g., E>100 GPa) materials, such as sapphire, aluminum nitride (AlN), aluminum gallium nitride (AlGaN), gallium nitride (GaN), lithium aluminate (LAO), lithium gallate (LGO), zinc oxide (ZnO), and the like.

Such high-elastic modulus dies may be less susceptible to die cracking or chipping at the package level than lower-elastic modulus dies (e.g., GaAs-based dies), and thus, may require different die attachment structures and/or methods. For example, as elastic modulus of the die increases, stress may shift from the die to the bonding area or interface between the die and the substrate, thereby resulting in delamination as shown in the examples of FIGS. 13A-13D and 14A-14C, rather than cracking or chipping. That is, stresses involved in die attach operations and structures are highly material-specific, and thus, materials, shapes, and/or other characteristics of a bond interface for one combination of materials may not be successfully applied to other material combinations.

Without wishing to be bound by theory, the present inventors have recognized that, for dies having a higher elastic modulus (e.g., greater than about 100 GPa, such as Si- or SiC-based dies), abrupt changes in shape of the bond area (such as sharp (e.g., 90 degree) corners) between the die and the substrate may, in combination with differences in CTE, may be a source of stress concentration. For example, some conventional device packages may attach a SiC die to a package substrate using a backside metallization layer having orthogonal corners. As used herein, orthogonal corners may refer to corners that define an angle of approximately 90 degrees, e.g., having a radius of curvature (also referred to herein as a corner radius) of about 10 microns or less. Moreover, the present inventors have recognized that, for higher elastic modulus dies, stress in the bond area increases with distance from a center of the die to the perimeter of the die, and that delamination of the die may thus occur due to such stress concentration.

Accordingly, embodiments described are directed to die attach elements and structures that are configured to reduce or alleviate stress in the bond area between the die and the package substrate. In particular, embodiments described herein may arise from realization that removal of sharp corners of the bonding area or bonding surface between the die and the package substrate (e.g., by forming the backside metal layer or otherwise defining a contact area with non-orthogonal corners) may significantly reduce stress in the bond area. In some embodiments, the non-orthogonal corners of the bonding surface may be defined by patterning the backside metal layer. In some embodiments, the non-orthogonal corners of the bonding surface may be defined by patterning the die itself, such that the backside metal layer has non-orthogonal corners as-deposited. Moreover, reducing the distance from a center to a corner of bond area (e.g., by increasing the radius of curvature or chamfer dimension of the corners of one or more layers defining the bond area) in accordance with embodiments described herein may further reduce stress in the bond area, which may reduce or prevent delamination between the die and the package substrate for higher-elastic modulus die materials.

Figure 1A:
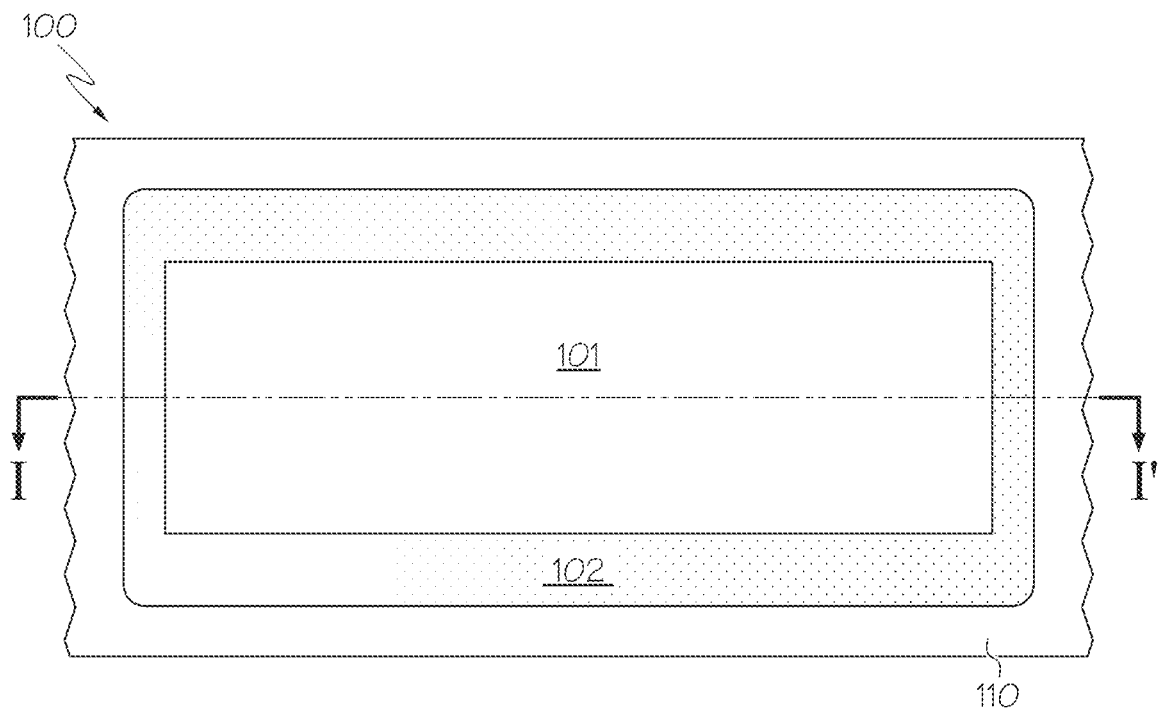
FIGS. 1A and 1B are top plan and cross-sectional views, respectively, of semiconductor device packages including a semiconductor die and a metal layer on a package substrate in accordance with some embodiments of the present disclosure.
Figure 1B:
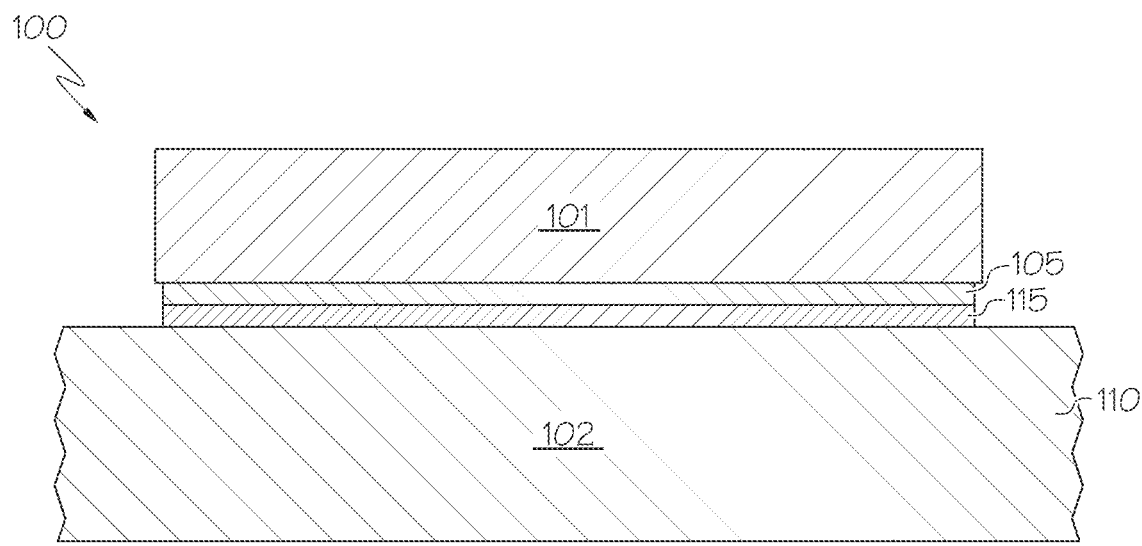
Figure 2A:
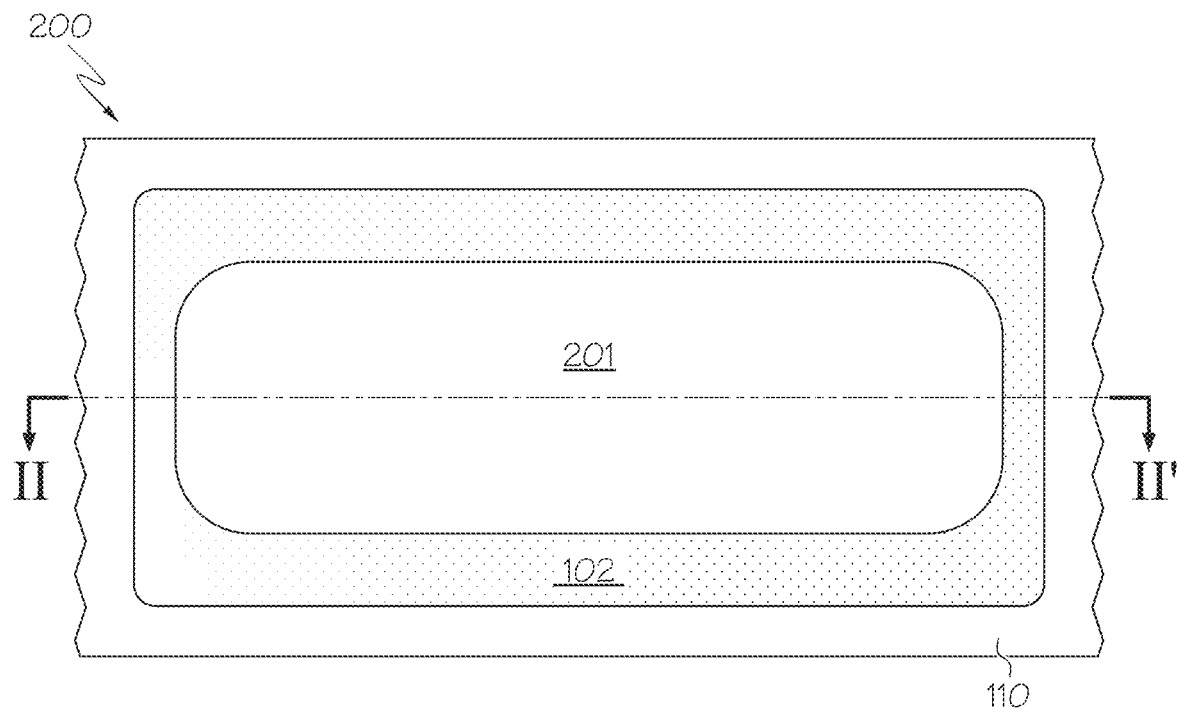
FIGS. 2A and 2B are top plan and cross-sectional views, respectively, of semiconductor device packages including a semiconductor die and a metal layer on a package substrate in accordance with some embodiments of the present disclosure.
Figure 2B:
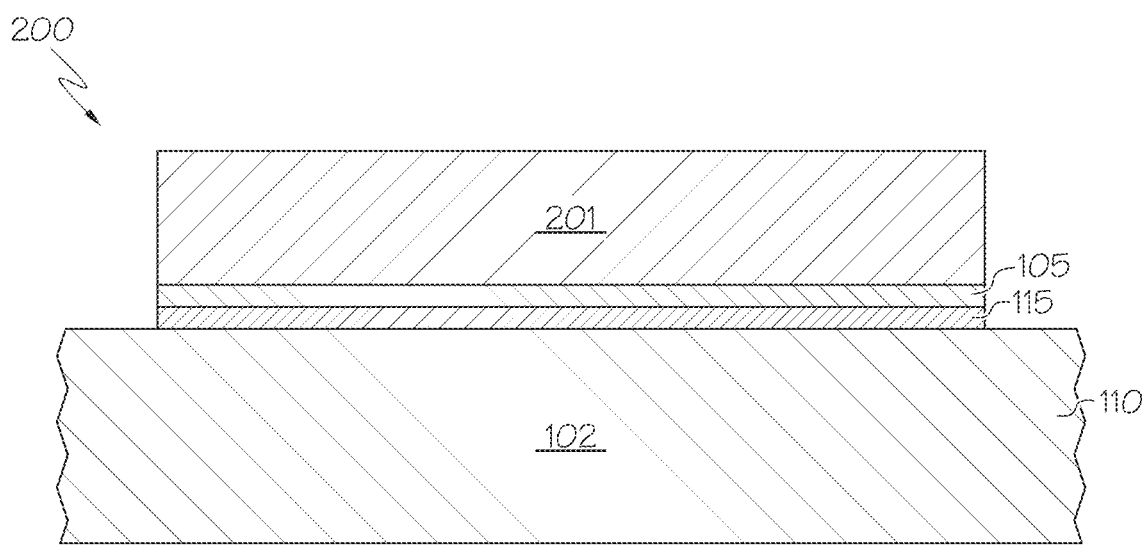

FIGS. 1A and 2A are plan views and FIGS. 1B and 2B are cross-sectional views taken along lines I-I' and II-II' of semiconductor device packages 100 and 200 including semiconductor dies 101 and 201, respectively. Attachment of the dies 101 and 201 to respective substrates 110 by respective metal or other bonding layers 105 on surfaces thereof (e.g., on back sides of the dies 101 and 201) will be described concurrently herein for brevity; however, it will be understood that the device packages 100 and 200 are separate embodiments and are not limited to identical die attach structures and/or methods.

Referring to FIGS. 1A-1B and 2A-2B, the die 101, 201 is attached to a substrate 110 (e.g., a package substrate) at a surface 102 (e.g., a die attach pad or flange) by a die attach material 115. The die attach pad or flange 102 may be a thermally and/or electrically conductive material. In some examples, the flange 102 and/or the substrate 110 may be part of the package 100, 200. The flange 102 may include a relatively soft metal such as copper (Cu), gold (Au), or aluminum (Al) with a relatively good thermal conductivity. For example, the flange 102 may be a copper alloy, such as copper-tungsten (CuW) or CPC (a copper, copper-molybdenum, copper laminate), or a metal-matrix composite. The CTE for the flange 102 may be about 20.

The die 101, 201 may be a semiconductor die, and may include transistors or other electrical devices. The die 101, 201 and flange 102 may have differing CTEs. For example, the die 101, 201 may be Si-based, SiC-based, and/or GaN-based, and the CTE for die 101, 201 may about 2 to 5. That is, in some embodiments, the CTE of the substrate surface 102 may be at least two times, at least three times, or at least five times greater than the CTE of die 101, 201 attached thereto.

The die attach material 115 that is used to attach the die 101, 201 to the substrate 110 or flange 102 may be selected based on the type of material of the die 101, 201. Die-attach material 115 may include any attaching material and/or adhesive material such as solder, paste, tape, glue, epoxy, and/or metal sinter. In some embodiments, the die attach material 115 may include an electrically conductive material, such as gold-tin (AuSn), gold-silicon (AuSi), gold-germanium (AuGe), etc. In some embodiments, the die attach material 115 may include nano sinter materials, such as nanosilver and/or nanocopper. The die attach material 115 may include more than one layer or component, and can be applied to the backside of the die 101, 201 and/or to the surface 102 of the substrate 110. The die attach material 115 may be configured to solidify when cooled from temperatures of the die attach process.

The metal or other bonding layer 105 on the surface (illustrated as a backside) of the die 101 may be an electrically conductive material, such as gold or a gold alloy, that defines a bonding surface for attachment of the die 101, 201 to the substrate 110 or flange 102 via the die attach material 115. In some embodiments, the connection between die 101, 201 and flange 102 may include metalized plated laser vias, solder, and/or high-pressure/high-frequency metalized bonding such as diffusion bonding. The connection between the die 101, 201 and the substrate 110, also referred to herein as a bond area, may thus include the metal layer 105, the die attach material 115, and/or the die attach pad/flange 102. The materials described herein for the metal layer 105, the flange 102, and/or the die attach material 115 are provided by way of example rather than limitation. In some embodiments, the backside metal 105 can be applied by sputtering and plating. The die attach material 115 can also be applied by sputtering and plating, and/or by foil or other preform.

In some embodiments, the materials of the metal layer 105, the flange 102, and the die attach material 115 may have similar CTEs (e.g., about 14.4, 17.1, and 16, respectively, for an Au metal layer 105, a Cu flange 102, and an AuSn die attach material 115). The materials of the metal layer 105 and the die attach material 115 may each have a similar elastic modulus E (e.g., about 77 GPa and 68 GPa, respectively, for an Au metal layer 105 and an AuSn die attach material 115).

The semiconductor die 101, 201 may include one or more semiconductor materials having a different elastic modulus and CTE than the metal layer 105 and the die attach material 115. In some embodiments, the die 101, 201 may be a semiconductor material having an elastic modulus of greater than about 100 GPa, and a CTE of less than about 5. For example, the die 101, 201 may be Si-based (having an elastic modulus of about 112 GPa and a CTE of about 2.6) or SiC-based (having an elastic modulus of about 410 GPa and a CTE of about 4). The elastic modulus for SiC is about 3.66 times higher than Si. Poisson's ratio (which may refer to the negative of the ratio of transverse strain to axial strain) for Si is two times higher than SiC (0.28 for Si, versus 0.14 for SiC). A GaN device layer, which may be formed on Si or SiC dies as described herein, may also have an elastic modulus of greater than 100 GPa (in particular, about 295 GPa).

As such, the semiconductor material of the die 101, 201 may have an elastic modulus that is about 1.5 times (for a Si-based die 101, 201) or more (for a GaN or SiC-based die 101, 201) than that of the die attach material 115, and/or a CTE that is about 2 to 5 times less than that of the flange 102 or substrate 110. In such embodiments, the weakest element among the die 101, 201, the substrate 110, and the bonding area 105/115/102 may be the die attach material 115 (e.g., gold-tin (AuSn) solder). The die attach material 115 may have a thickness of about 3 microns (or less) to about 25 microns (or more). For example, the die attach material 115 may have a thickness of about 10 microns or less, about 5 microns or less, or less than 3 microns in some instances. The stress resulting from the differences or mismatch in CTE between the materials of the die 101, 201 and the substrate 110 or die attach pad 102 (in some instances, a CTE mismatch of about 10 or more) may thus be shifted the bonding area 105/115/102, which may result in delamination of the die 101, 201 from the substrate 110.

Embodiments herein may address these and other problems by reducing the stress at the bond area 105/115/102 by forming a bonding surface that defines a contact area with non-orthogonal (e.g., radiused or chamfered) corners. As discussed above, the use of higher elastic modulus materials for the die 101, 201 and the substrate 110 may shift stress (e.g., due to CTE mismatch between the die 101, 201 and the substrate 110 and/or flange 102 material) into the bond area 105/115/102. This stress may be concentrated at orthogonal corners or other abrupt changes in shape in the bond area 105/115/102. Embodiments of the present disclosure thus provide bonding surfaces with non-orthogonal corners, which are shaped or otherwise configured to reduce stress concentration in the bond area 105/115/102, and thus, incidence of delamination of the die 101, 102 from the substrate 110.

Figure 1C:
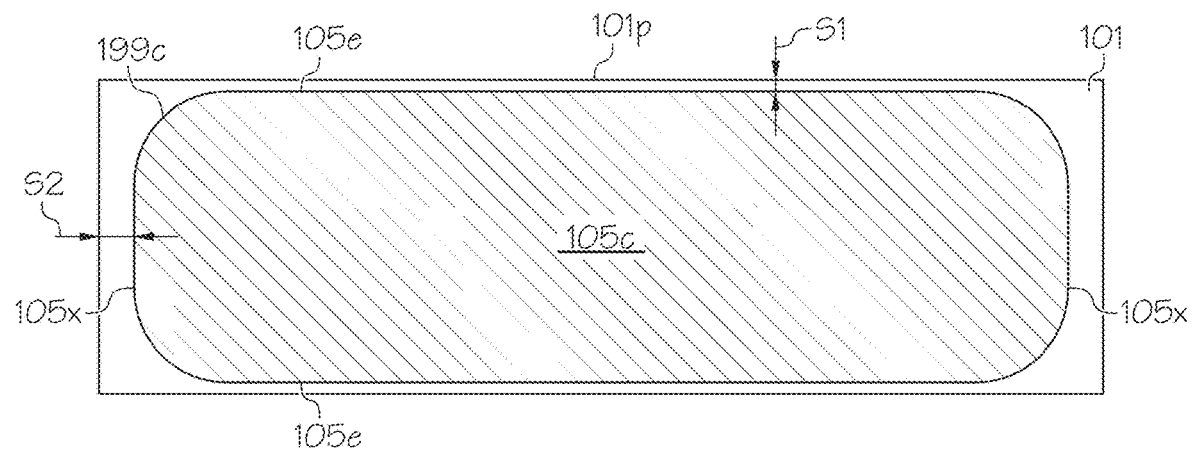
FIGS. 1C and 1D are bottom plan views illustrating example bonding surfaces of the semiconductor die of FIGS. 1A and 1B.
Figure 1D:
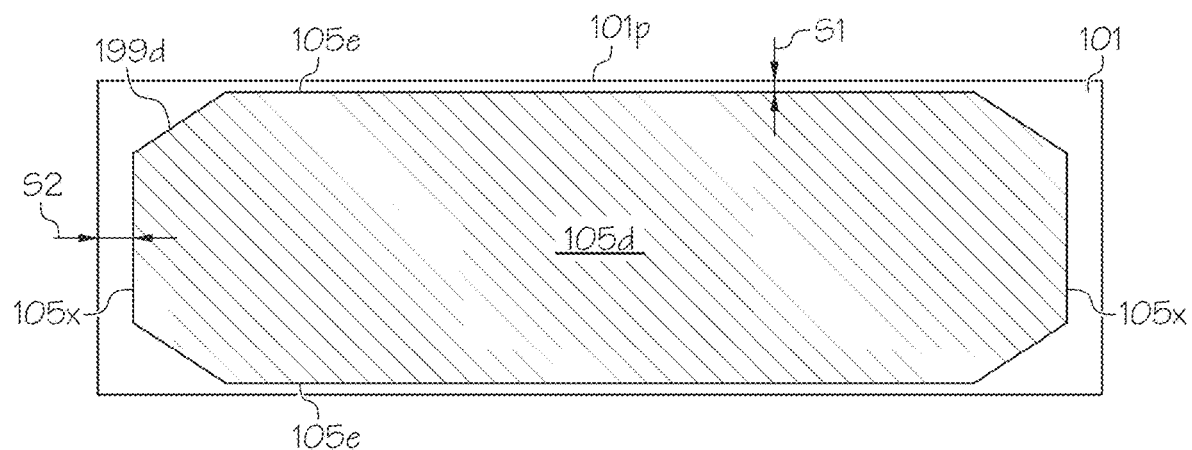
Figure 2C:
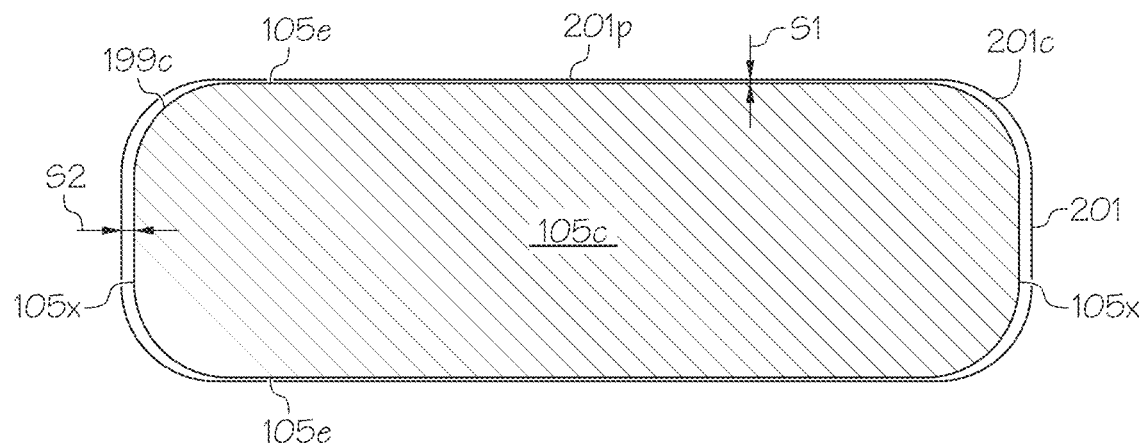
FIGS. 2C and 2D are bottom plan views illustrating example bonding surfaces of the semiconductor die of FIGS. 2A and 2B.
Figure 2D:
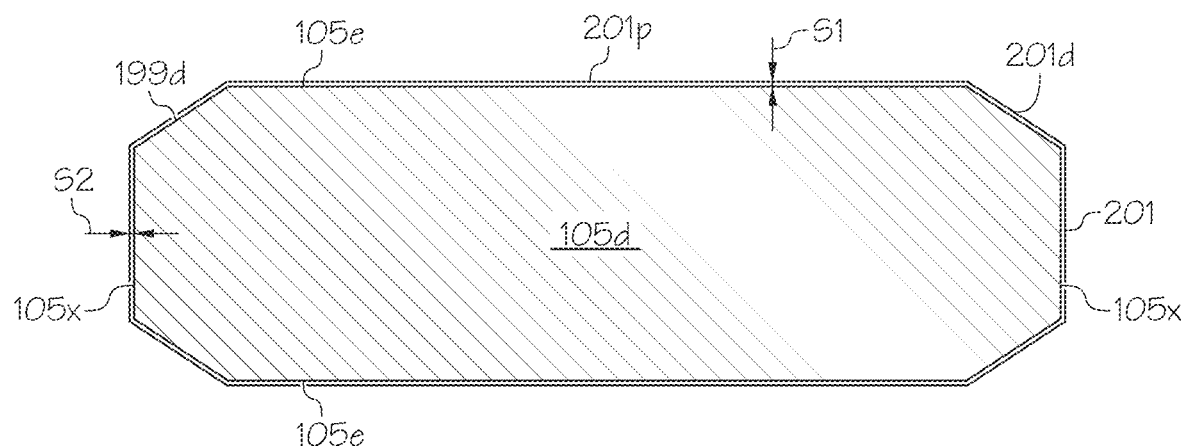

FIGS. 1C-1D and 2C-2D illustrate example bonding surfaces for the dies 101 and 201, respectively, in accordance with embodiments of the present disclosure. The bonding surfaces include one or more non-orthogonal corners that are configured to reduce stress in the bond area 105/115/102. In particular, some bonding surfaces described herein may relieve stress concentration in the bond area 105/115/102 by providing a bonding surface 105c with one or more radiused corners 199c (as shown in FIGS. 1C and 2C) or a bonding surface 105d with one or more chamfered corners 199d (as shown in FIGS. 1D and 2D). In some embodiments, the radiused or chamfered corners of the bonding surface 105c or 105d may have a radius of curvature or chamfer dimension, respectively, of about 100 microns or more. For example, the radius of curvature or chamfer dimension may be about 200 microns or more, or about 300 microns or more.

In some embodiments, the bonding surface 105c, 105d having the non-orthogonal corners 199c, 199d may be defined by patterning the metal layer 105 on a surface of the die 101, as shown in FIGS. 1C and 1D. For example, the metal layer 105 may be a metallization layer on the backside of the die 101. The metal layer 105 may be patterned using a mask in combination with a sputtering or plating process to provide the bonding surface 105c with the one or more radiused corners 199c, or the bonding surface 105d with the one or more chamfered corners 199d. That is, the shape of the bonding surface 105c, 105d that defines the contact area (including non-orthogonal corners as described herein) may differ from the shape of the surface of the die 101 (which may have orthogonal corners).

Patterning the metal layer 105 on the surface of the die 101 as shown in FIGS. 1C and 1D may provide further benefits at the die level, in addition to the above-described package level benefits of reduced delamination. In particular, dicing or otherwise singulating the die 101 from a semiconductor wafer using mechanical processes (e.g., sawing) may induce damage to the deposited metal layer 105 (for example, metal tags, metal delamination, and/or metal smearing) and/or to the die 101 (for example, die chipping). That is, defects including (but not limited to) metal delamination, metal tags, metal smearing, and/or die chipping may be caused by the process of mechanically dicing through both the wafer (e.g., an SiC wafer) and the unpatterned metal layer 105 thereon.

Figure 15:
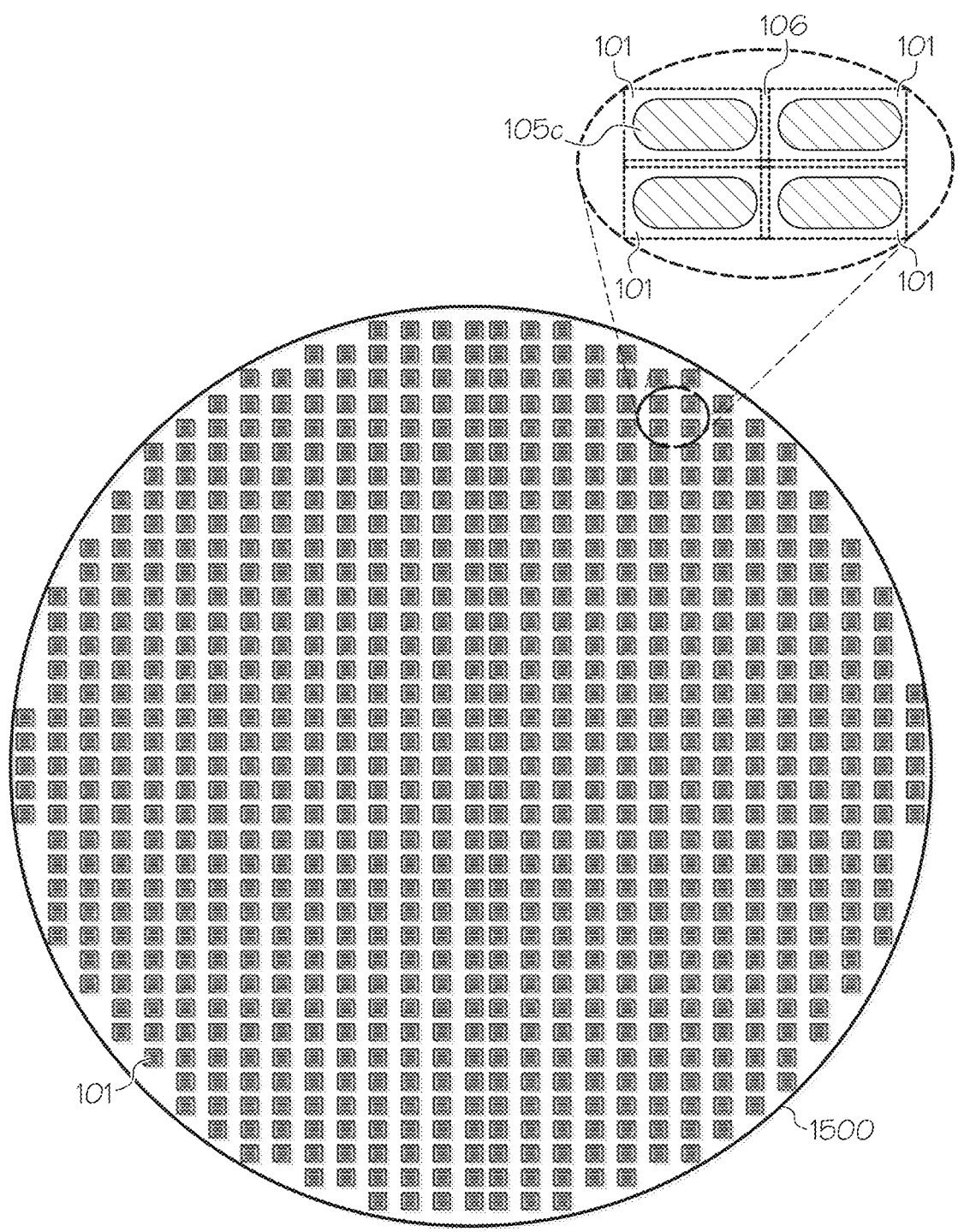
FIG. 15 is a plan view illustrating a semiconductor wafer that may be patterned and singulated to provide respective semiconductor dies including bonding surfaces in accordance with some embodiments of the present disclosure.

However, as shown for example in FIG. 15, patterning of the metal layer 105 to define the bonding surface 105c (or 105d) in accordance with some embodiments described herein (e.g., using a mask in combination with a sputtering or plating process) may prevent or avoid deposition of the metal layer 105 in the scribe lines or streets (illustrated by dotted lines 106) between adjacent dies 101 on the wafer 1500. Subsequent mechanical dicing of the dies 101 from the wafer 1500 along the streets 106 may thus avoid dicing through portions of the metal layer 105. In FIGS. 1C and 1D, the spacings S1 and S2 between the bonding surface 105c, 105d and the perimeter 101p of the die 101 may result from the absence of the metal layer 105 in the scribe lines or streets 106, which define the perimeter 101p of the resulting die 101 after the dicing process. Recessing or avoiding deposition of the metal layer 105 in the streets 106 using patterning processes as described herein can thus reduce or avoid the above-described and/or other defects that may be induced by mechanical separation of the die 101 from the wafer 1500 by dicing through a deposited metal layer 105.

Figure 3:
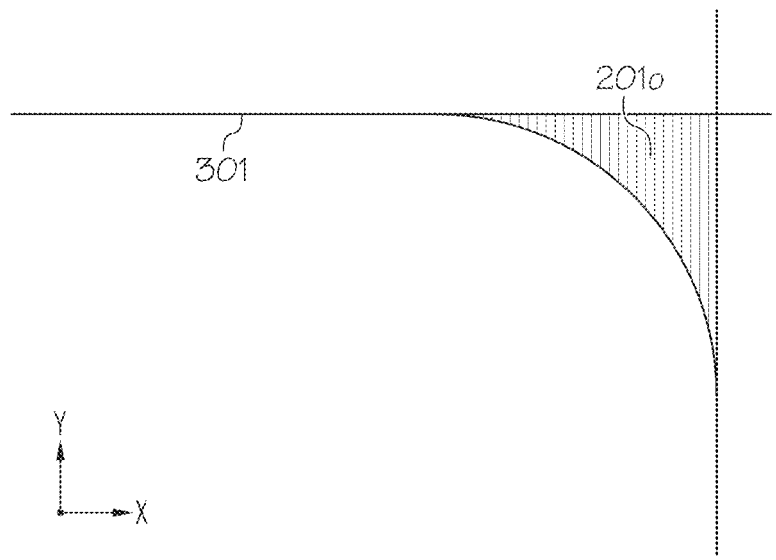
FIG. 3 illustrates an example of laser dicing operations in accordance with some embodiments of the present disclosure.

In some embodiments, the bonding surface 105c, 105d having the non-orthogonal corners may be defined by radiusing or chamfering the corners of the die 201 itself, as shown in FIGS. 2C and 2D. For example, in singulating the die 201 from a semiconductor wafer, a laser or other dicing process may cut the radius 201c or chamfer 201d at one or more corners of the die 201. In some embodiments, the laser may cut the radius 201c or chamfer 201d at the corner of the die 201 at a same speed as cutting the straight opposing edges along the perimeter 201p of the die 201. A software-enhanced x-y table may be used to control the laser cutting, with the path 301 of the laser shown by way of example in FIG. 3. A burr may remain on the wafer tape to define the desired radiusing or chamfering. As such, as shown in FIG. 3, an orthogonal corner piece 201o of the die 201 may be removed. In other embodiments, the duration of lasing may be increased at the corners of the die 201, such that a greater duration of lasing may increase the curvature of the radiused corners 201c. The die 201 may thus include laser-ablated corners 201c, 201d and edges defining the perimeter 201p. The metal layer 105 may be formed (e.g., by a sputtering or plating process, with or without a mask) on the surface of the laser-diced die 201 to provide the bonding surface 105c with the one or more radiused corners 199c, or the bonding surface 105d with the one or more chamfered corners 199d. That is, the shape of the bonding surface 105c, 105d (including non-orthogonal corners as described herein) may be defined by or may otherwise correspond to the shape of the surface of the die 201 (which may likewise include non-orthogonal corners). In other words, the shape of the die 201 may define the contact area provided by the bonding surface 105c, 105d.

In the embodiments of FIGS. 1C, 1D, 2C, and 2D, the metal layer 105 defining the opposing edges 105e of the bonding surface 105c, 105d may be a metallization layer that is formed on the backside of the die 101, 201 to extend along a perimeter 101p, 201p thereof. In some embodiments, the opposing edges 105e of the bonding surface 105c, 105d may extend at a spacing S1 (also referred to as pullback) of about 50 microns or less (e.g., about 25 microns or less) from the perimeter 101p, 201p of the die 101, 201. For example, in FIGS. 1C and 1D, opposing edges 105e of the bonding surface 105c, 105d may extend at a spacing S1 of about 25 microns or less from the perimeter 101p of the die 101. The spacing S2 between the perimeter 101p of the die 101 and opposing ends 105x of the bonding surface 105c, 105d may be greater than the spacing Si.

In some embodiments, the opposing edges 105e of the bonding surface 105c, 105d may extend to the edges of the surface of the die 101, 201 (i.e., with substantially no spacing between the edges 105e and the perimeter 101p, 201p). For example, in FIGS. 2C and 2D, opposing edges 105e of the bonding surface 105c, 105d may extend at a spacing S1 of less than about 5 microns from the perimeter 201p of the die 201. The spacing S2 between opposing ends 105x of the bonding surface 105c, 105d and the perimeter 201p of the die 101 may be substantially equal to the spacing S1 along the opposing edges 105e. That is, in some embodiments, the distance or spacing between the edges or perimeter 101p, 201p of the die 101, 201 and the edges 105e of the bonding surface 105c, 105d may be zero (e.g., when using a blanket metal deposition process to define the metal layer 105 extending conformally around the perimeter 201p of the die 201 such that the edges 105e of the bonding surface 105c, 105d and the perimeter 201p of the die 201 are aligned) or up to about 50 microns (e.g., by using a sputtering or plating process in combination with a mask to define the metal layer 105).

Forming the bonding surface 105c, 105d along and/or up to the perimeter 101p, 201p of the die 101, 201 may provide for a stronger bond with the substrate 110/flange 102, which may not be possible with lower elastic modulus die materials (e.g., with E<100 GPa), due to problems with cracking or chipping at the perimeter of the die. In some embodiments, the bonding surface 105c, 105d may define a step difference relative to the surface of the die 101, 201. The step difference may correspond to the thickness of the metal layer 105. In some embodiments, the metal layer 105 may have a thickness of about 10 microns or less, for example, a thickness of about 6 microns.

Semiconductor device packages in accordance with embodiments of the present disclosure, such as the packages 100, 200, may include additional components not shown in FIG. 1A-1B or 2A-2B, such as a case or housing, additional electrically conductive or thermally conductive components, additional dies, and/or additional semiconductor components. Also, the die 101, 201 may include one or more device layers including semiconductor devices therein, such as Schottky diodes, RF power transistor devices, e.g., HEMTs (high electron mobility transistors) and/or power MOSFETs (metal oxide semiconductor field effect transistor) such as LDMOS (laterally diffused metal oxide semiconductor) devices or SiC MOSFETs. Examples of such semiconductor devices are described below with reference to FIGS. 12A and 12B.

Figure 4:
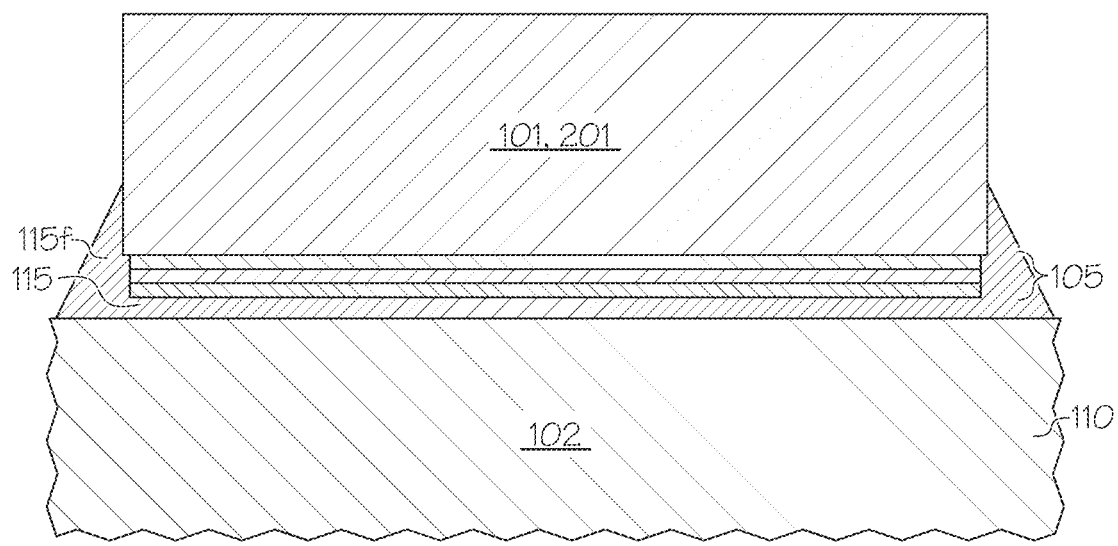
FIG. 4 is an enlarged, cross-sectional view of a bond area in accordance with some embodiments of the present disclosure.

FIG. 4 is an enlarged, cross-sectional view of the bond area including the die attach material 115, the metal layer 105, and the flange or attachment surface 102 of the substrate 110 of FIG. 1B or 2B. The bonding surface 105c, 105d is attached to the surface 102 of the substrate 110 by the die attach material 115. As discussed above, the non-orthogonal corner(s) 199c, 199d of the bonding surface 105c, 105d are shaped or otherwise configured to reduce stress at an interface between the bonding surface 105c, 105d and the die attach material 115.

The stress-reducing effects provided by the non-orthogonal corner(s) of the bonding surface 105c, 105d may be highly material-specific, thickness-specific, and/or contact area specific, particularly for high elastic modulus materials (e.g., having E>100 GPa) as described herein. As noted above, the flange or substrate surface 102 may be an electrically conductive material, such as a copper layer or an alloy or metal-matrix composite thereof. For example, in some embodiments the flange 102 may be a copper-molybdenum (CuMo) layer, CPC (Cu/MoCu/Cu), or may be other copper alloys, such copper-tungsten CuW, and/or other laminate/multi-layer structures.

The metal layer 105 may be an electrically conductive layer on the die 101, 201. For example, the metal layer 105 may include gold (Au) or an alloy thereof, and may have a thickness of about 15 microns or less, for example, about 10 microns or less. As shown in FIG. 4, the metal layer 105 may be a backside metallization layer having a multi-layer metal stack structure. Examples of a backside metal stack 105 between a high-elastic modulus die 101/201 (such as Si or SiC) and a high-elastic modulus flange 102 or substrate 110 may include, but are not limited to, multi-layer metal stacks including titanium (Ti), titanium tungsten (TiW), gold (Au), platinum (Pt), nickel (Ni), and/or aluminum (Al). It will be understood that the materials and thicknesses of the metal layer 105 are described by way of example only, and the metal layer 105 may include other materials and/or thicknesses that are configured to reduce stress at the bond interface, including the die attach materials 115 described herein.

The die attach material 115 may be an electrically conductive material, such as gold-tin (AuSn), gold-silicon (AuSi), gold-germanium (AuGe), etc. The thickness of the die attach material 115 and/or the contact area between the die attach material 115 and the bonding surface 105c, 105d may significantly affect stress at the interface therebetween. In some embodiments, increased or maximum stress may occur at the metal layer 105-die attach material 115 interface.

Figure 5:
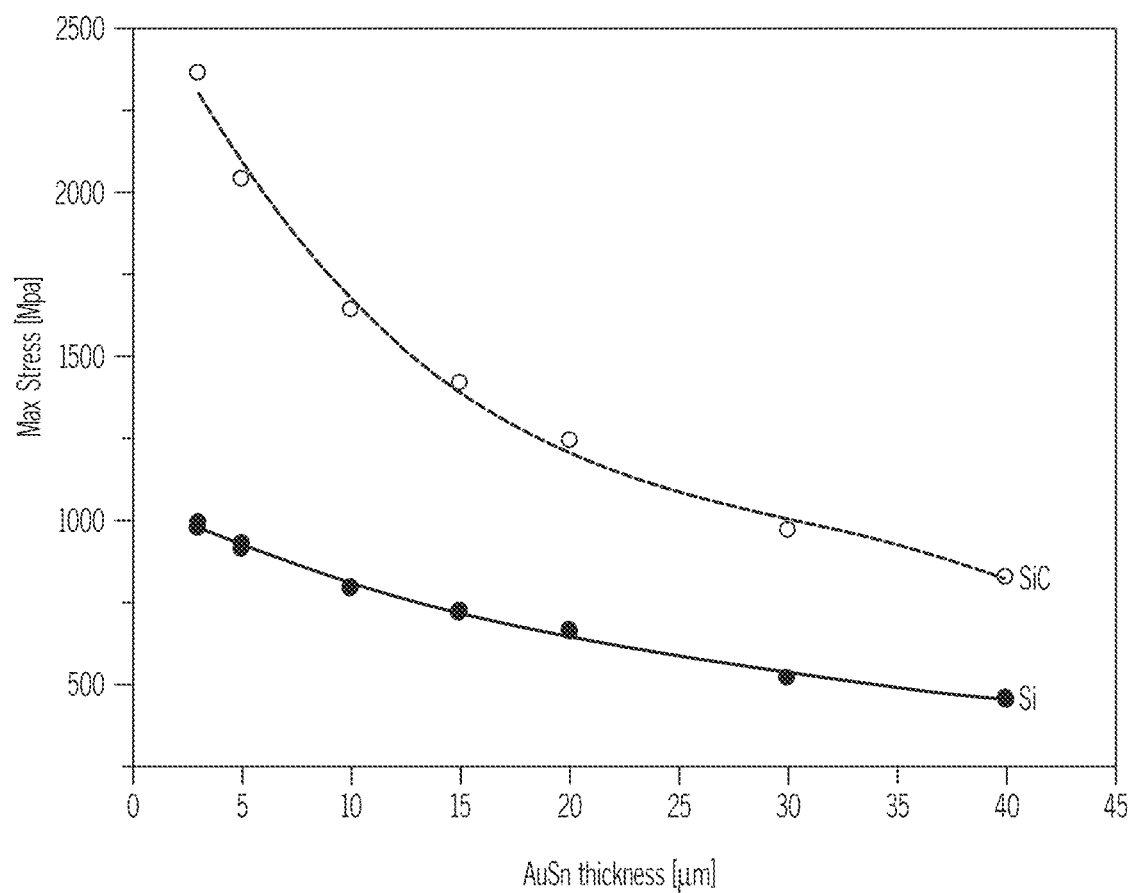
FIG. 5 is a graph illustrating stress at the bond area vs. thickness of the die attach material in accordance with some embodiments of the present disclosure.

FIG. 5 is a graph illustrating stress (in megapascals (MPa)) at the bond area vs. thickness (in micrometers (μm) or microns) of an AuSn die attach material for attachment of high-elastic modulus Si and SiC dies to a substrate (e.g., a package substrate) in accordance with embodiments of the present disclosure. As shown in FIG. 5, stress at the bond area may be significantly reduced (e.g., by about 2 times higher or more) as thickness of the AuSn die attach material is increased. The thickness of the die 101, 201 may also affect stress. In some embodiments, the die 101, 201 may have a thickness of about 25 to about 500 microns, and the die attach material 115 may have a thickness of about 1 to about 100 microns. For example the die 101, 201 may have a thickness of about 50 to about 150 microns, and the die attach material 115 may have a thickness of about 3 to about 40 microns. It will be understood that these thicknesses of the die 101, 201 and/or the die attach material 115 are provided by way of example only, and the die 101, 201 and/or the die attach material 115 as described herein may include other thicknesses such that bonding surfaces in accordance with embodiments described herein may reduce stress at the bond interface so as to reduce or prevent delamination.

The thickness of the die attach material relative to the thickness of the metal layer may also help reduce stress. In some embodiments, the thickness of the die attach material 115 may be less than that of the metal layer 105. For example, an Au metal layer 105 may have a thickness of about 6 microns, while an AuSn die attach material 115 may have a thickness of about 3 microns, that is, about half or less than the thickness of the metal layer 105.

Referring again to FIG. 4, the die attach material 115 may include a fillet 115f at corners and/or a perimeter of the bonding surface 105c, 105d. The fillet 115f may further increase strength and/or reduce stress at the interface between the bonding surface 105c, 105d and the die attach material 115, e.g., particularly at the corners, by increasing the contact area between the bonding surface 105c, 105d and the die attach material 115. More particularly, FIG. 4 illustrates that the bond between the die 101, 201 and the flange 102 includes not only the bonding surface 105 at the bottom of the die 101, 201, but also the portions of the fillet 115f that attach to the sidewalls of the die 101, 201. The fillet 115f along the sidewalls of the die 101, 201 may also help reduce or minimize die edge singularity issues, as may be indicated in modeling. In some embodiments, the fillet 115f may protrude from the die attach material 115 along the sidewalls of the die 101, 201 by about twice the thickness of the die attach material 115 or more, for example, by about two, three, or four times the thickness of the die attach material 115.

Bonding surfaces having non-orthogonal corners in accordance with embodiments described herein can significantly reduce stress in the bond area, particularly at the interface between the metal layer and the die attach material for high elastic modulus dies as described herein. The effectiveness of bonding surfaces described herein in reducing stress at the bond area is described below with reference to FIGS. 6A to 11C. Unless noted otherwise, bond surfaces and stress profiles described with reference to FIGS. 6A to 11C were obtained from thermo-mechanical stress simulations modeled for a 100 micron-thick SiC die, coated with a 6 micron-thick gold layer as the backside metallization, and having a 3 micron-thick layer of AuSn solder as the die attach material.

Figure 6A:
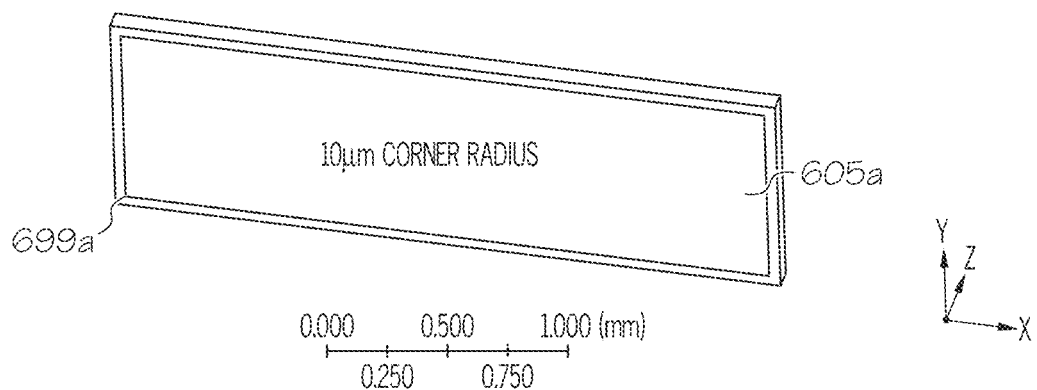
FIG. 6A illustrates a conventional bonding surface and FIGS. 6B and 6C illustrate example bonding surfaces having corners with different radius of curvature in accordance with some embodiments of the present disclosure.
Figure 6B:
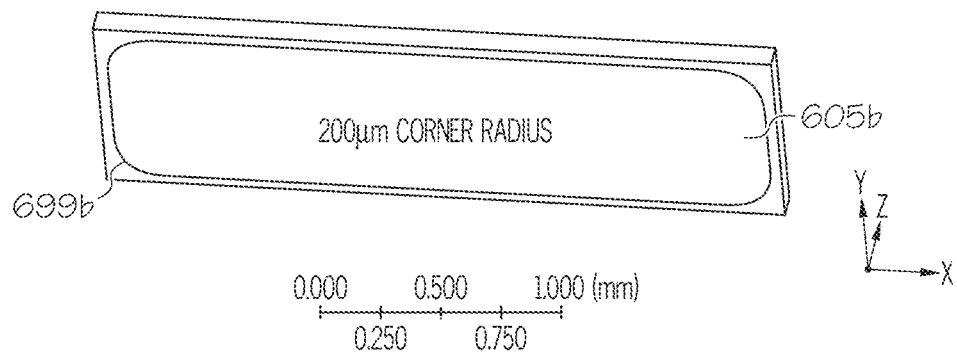
Figure 6C:
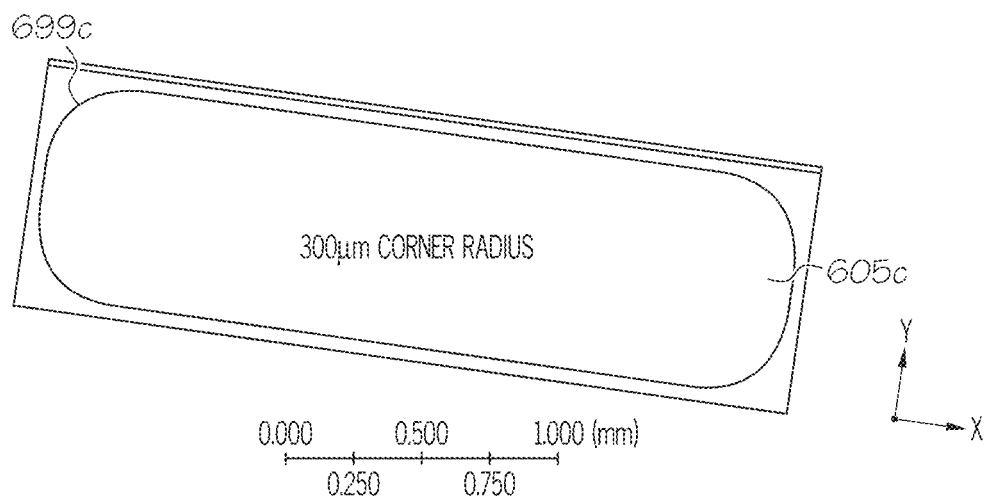
Figure 7A:
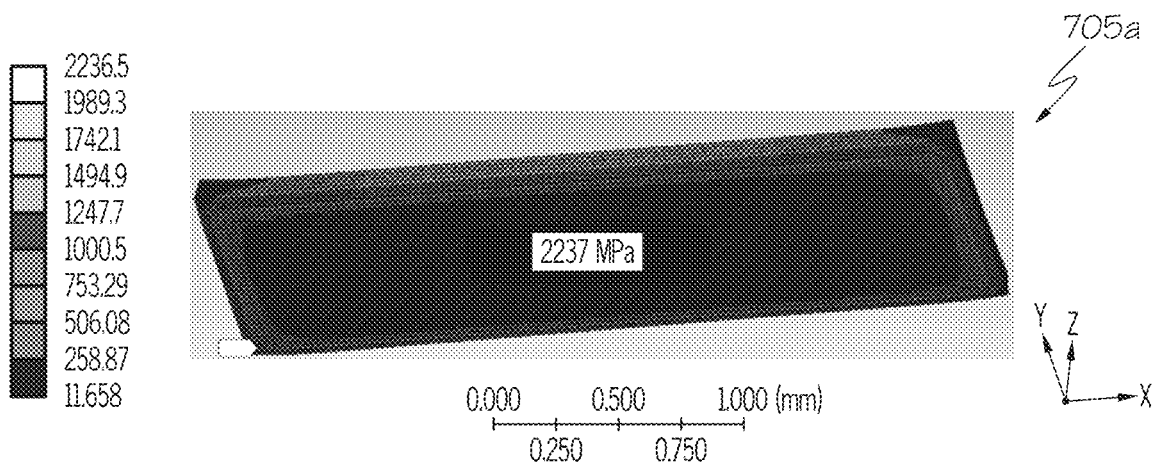
FIGS. 7A, 7B, and 7C illustrate relative stress profiles for the bonding surfaces of FIGS. 6A, 6B, and 6C, respectively.
Figure 7B:
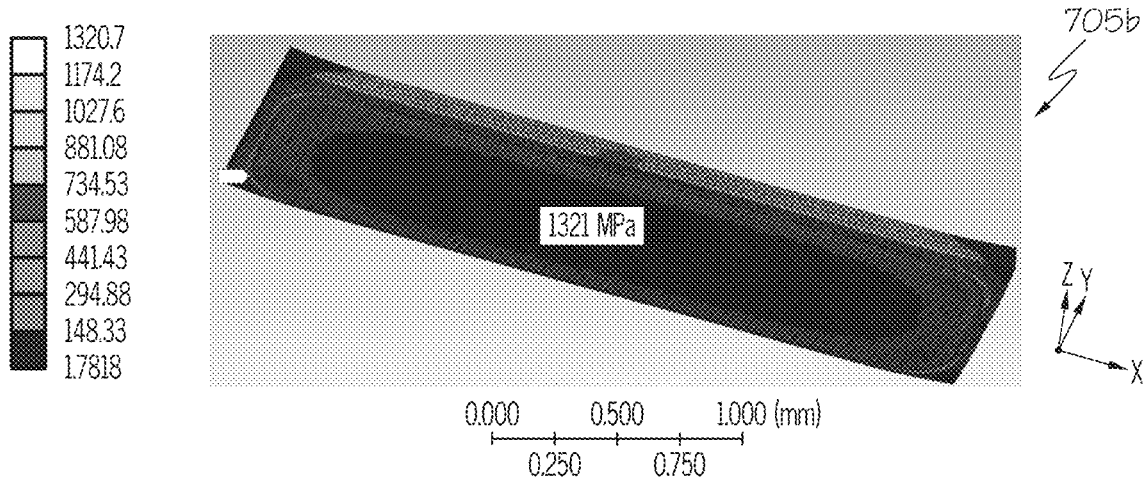
Figure 7C:
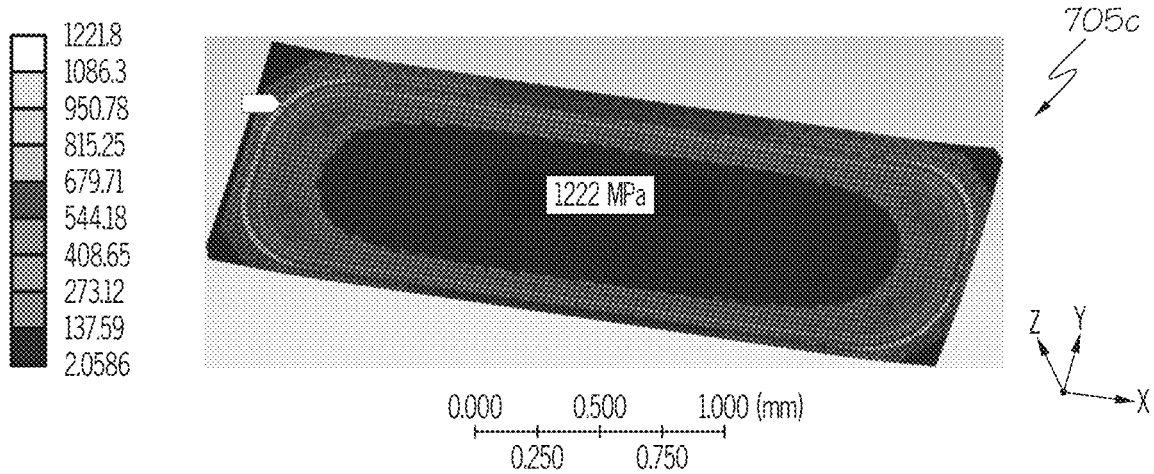

In particular, FIGS. 6A, 6B, and 6C illustrate stress alleviation in example bonding surfaces 605a, 605b, and 605c, respectively, each having corners with a different radius of curvature. FIGS. 7A, 7B, and 7C illustrate relative stress profiles 705a, 705b, 705c (in megapascals (MPa)) for the bonding surfaces 605a, 605b, and 605c of FIGS. 6A, 6B, and 6C, respectively, based on attachment to a copper-based flange or package substrate surface. The stresses 705a, 705b, and 705c shown in FIGS. 7A, 7B, and 7C may indicate a ratio of tensile stress to tensile strain in one or more directions along the bonding surfaces 605a, 605b, and 605c, which may manifest from mismatch of coefficients of thermal expansion between the materials of the die and the flange or substrate.

FIGS. 6A and 7A illustrate a bonding surface 605a and stress profile 705a for conventional die attachment (that is, where the bonding surface 605a has orthogonal corners, with a corner radius of about 10 microns). As shown in FIGS. 6A and 7A, the stress profile 705a indicates that maximum stress occurs at the corners 699a of the bonding surface 605a, while stress is significantly reduced towards the center of the bonding surface 605a.

FIGS. 6B and 7B illustrate a bonding surface 605b and stress profile 705b for die attachment structures in accordance with some embodiments of the present disclosure where the bonding surface 605b provided by a backside metallization layer has radiused corners 699b with a corner radius of about 200 microns. As shown in FIGS. 6B and 7B, while the stress profile 705b still indicates maximum stress at the corners 699b of the bonding surface 605b, the corners having a radius of curvature of about 200 microns may reduce the maximum stress by about 40% or more as compared to the bonding surface 605a having orthogonal corners.

FIGS. 6C and 7C illustrate a bonding surface 605c and stress profile 705c for die attachment structures in accordance with some embodiments of the present disclosure where the bonding surface 605c provided by a backside metallization layer has radiused corners 699c with a corner radius of about 300 microns. As shown in FIGS. 6C and 7C, the stress profile 705c indicates that, for a bonding surface 605c including radiused corners 699c having a radius of curvature of about 300 microns, maximum stress may be reduced by about 45% or more as compared to the bonding surface 605a having orthogonal corners.

The stress profiles 705a, 705b, 705c also indicate that stress is significantly reduced towards the center of the bonding surface 605a, 605b, 605c as compared to the corners 699a, 699b, 699c. In particular, as shown by the differences in shading between the stress profiles 705a, 705b, and 705c at the perimeter of the bonding surfaces 605a, 605b, and 605c, the bonding surface 605b with a corner radius of about 200 microns has not only less peak stress but also lower concentration of the stress at its perimeter than the bonding surface 605a with the orthogonal corners 699a. Likewise, the bonding surface 605c with a corner radius of about 300 microns has less peak stress and lower concentration of the stress at its perimeter than the bonding surface 605b. That is, the bonding surfaces 605b and 605c with increasing corner radiuses may provide a greater distribution of stress over their respective surface areas. As such, increasing the corner radius (and thus, reducing the distance from the center of a die to the corners of the die) in accordance with embodiments of the present disclosure can significantly reduce stress in terms of both magnitude and concentration over the bonding surface, particularly for high-elastic modulus dies (e.g., with E>100 GPa) as described herein which may shift stress from the die to the bond area.

Figure 8A:
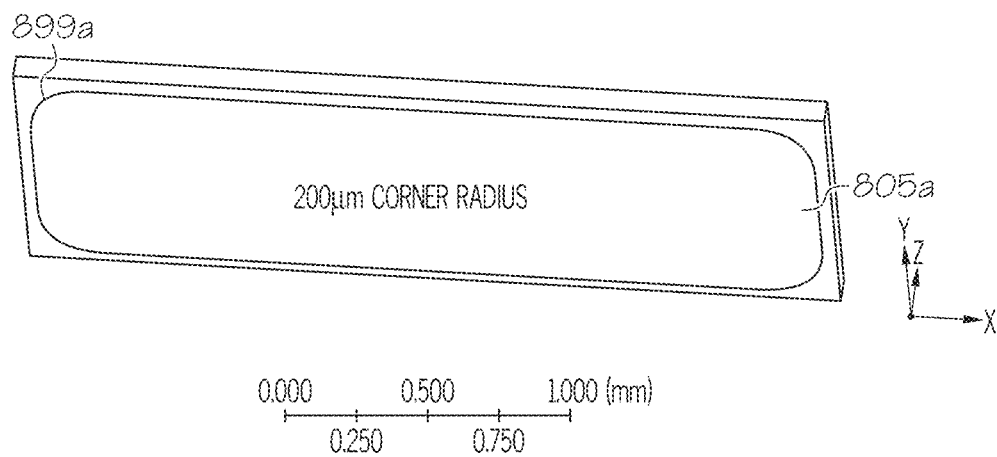
FIGS. 8A and 8B illustrate example bonding surfaces having radiused and chamfered corners, respectively, in accordance with some embodiments of the present disclosure.
Figure 8B:
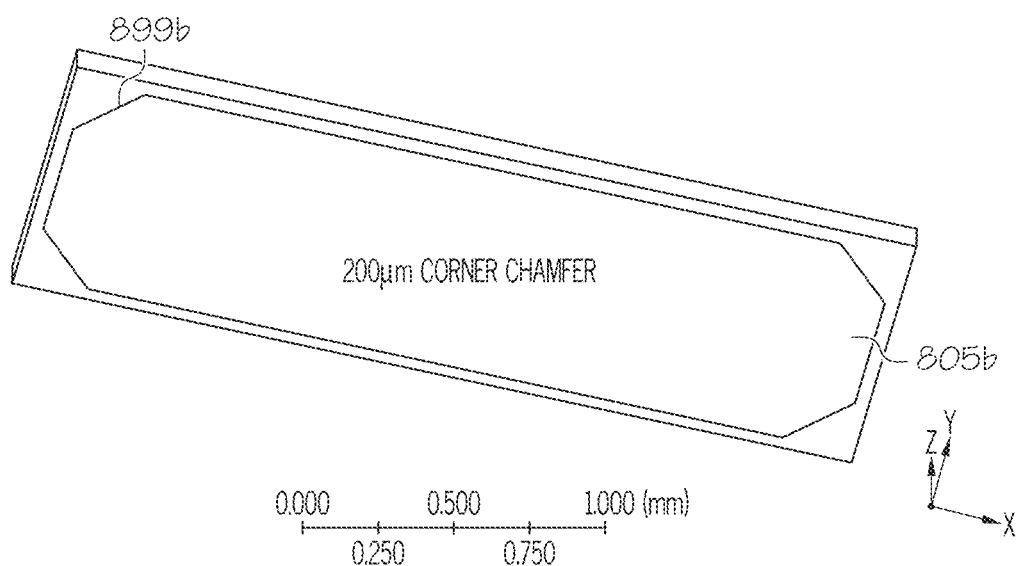
Figure 9A:
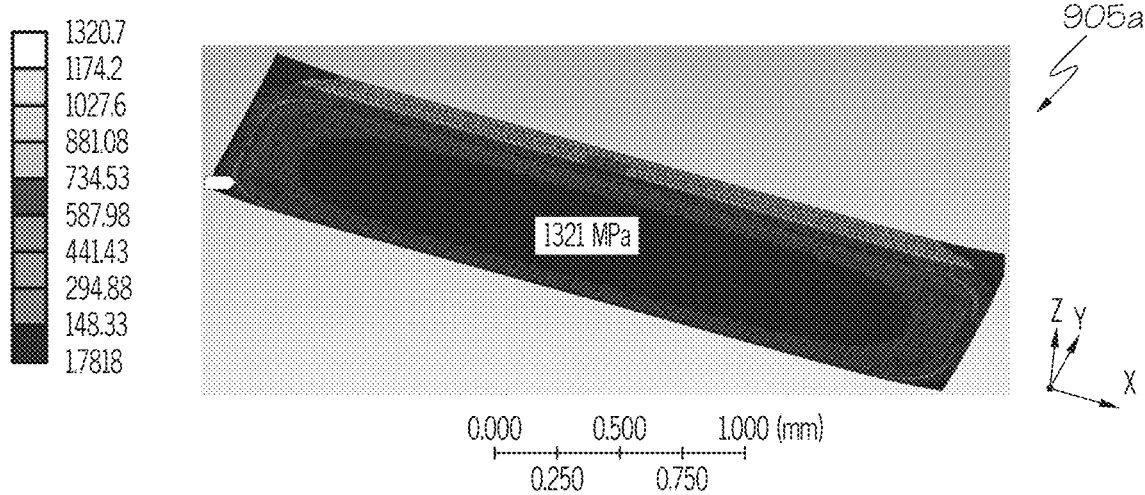
FIGS. 9A and 9B illustrate relative stress profiles for the bonding surfaces of FIGS. 8A and 8B, respectively.
Figure 9B:
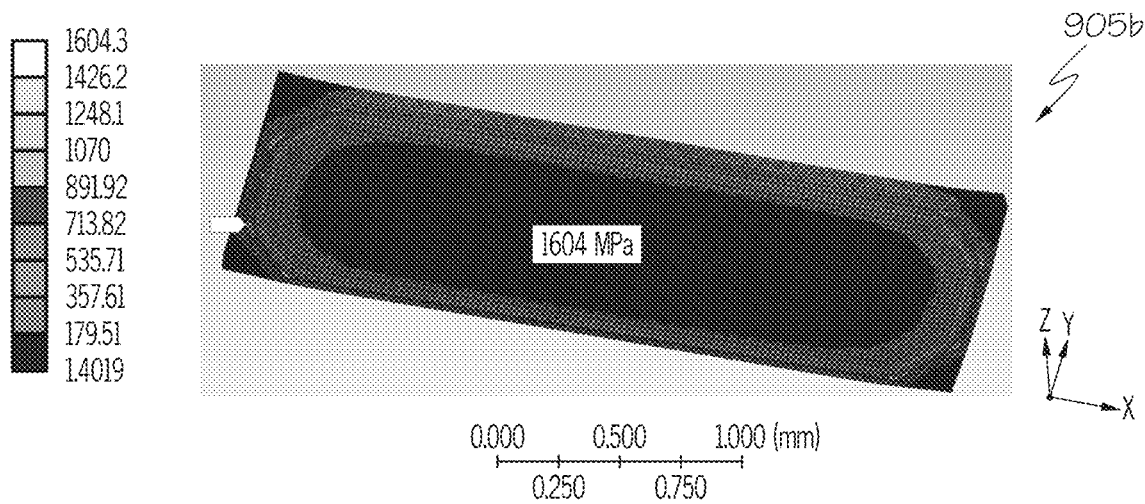

Bonding surfaces having non-orthogonal corners in accordance with embodiments described herein are not limited to the radiused corners described above with reference to FIGS. 6A to 7C, but may include chamfered corners as well. FIGS. 8A and 8B illustrate stress alleviation in example bonding surfaces 805a and 805b provided by a backside metallization layer having radiused and chamfered corners, respectively, in accordance with some embodiments of the present disclosure. FIGS. 9A and 9B illustrate relative stress profiles 905a and 905b (in MPa) for the bonding surfaces 805a and 805b of FIGS. 8A and 8B, respectively, based on attachment to a copper-based flange or package substrate surface. The stress profiles 905a, 905b may indicate a ratio of tensile stress to tensile strain in one or more directions along the bonding surfaces 805a, 805b, due to mismatch of coefficients of thermal expansion between the materials of the die and the flange or substrate.

As shown in FIGS. 8A and 9A, the bonding surface 805a has radiused corners 899a with a corner radius of about 200 microns, and the stress profile 905a indicates a reduction in maximum stress by about 40% or more as compared to the stress profile 705a of the bonding surface 605a having orthogonal corners 699a (e.g., with a corner radius of about 10 microns). As shown in FIGS. 8B and 9B, the bonding surface 805b having chamfered corners 899b with a chamfer dimension of about 200 microns may provide a reduction in maximum stress by up to about 30% as compared to the bonding surface 605a having orthogonal corners 699a. However, the bonding surface 805b having the 200-micron chamfered corners may provide a greater distribution of stress over its surface area than the bonding surface 805a, as shown by the differences in shading between the stress profiles 905b and 905a at the perimeter of the bonding surfaces 805b and 805a, respectively. That is, the bonding surface 805b with the chamfered corners 899b may provide a greater distribution of stress (albeit with a lesser reduction in magnitude of the stress) than the bonding surface 805a with the radiused corners 899a, for the same 200-micron chamfer dimension or radius of curvature. Both chamfered- and radiused-corner bonding surfaces in accordance with embodiments of the present disclosure provide a reduction in both magnitude and concentration of stress as compared to conventional bonding surfaces with orthogonal corners, with the radiused-corner bonding surfaces providing a greater reduction in maximum stress than the chamfered-corner bonding surfaces in some embodiments.

Figure 10A:
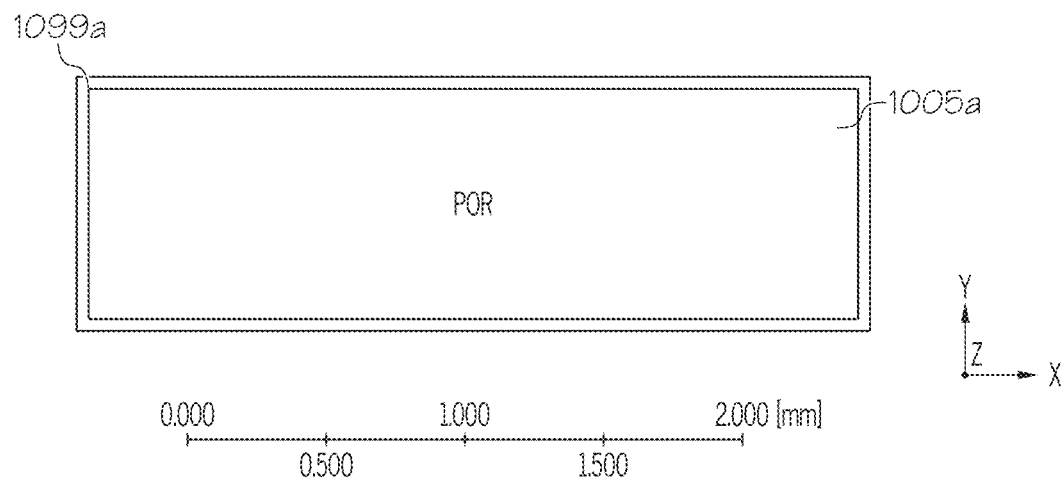
FIG. 10A illustrates a conventional bonding surface and FIG. 10B illustrates an example bonding surface having radiused corners in accordance with some embodiments of the present disclosure.
Figure 10B:
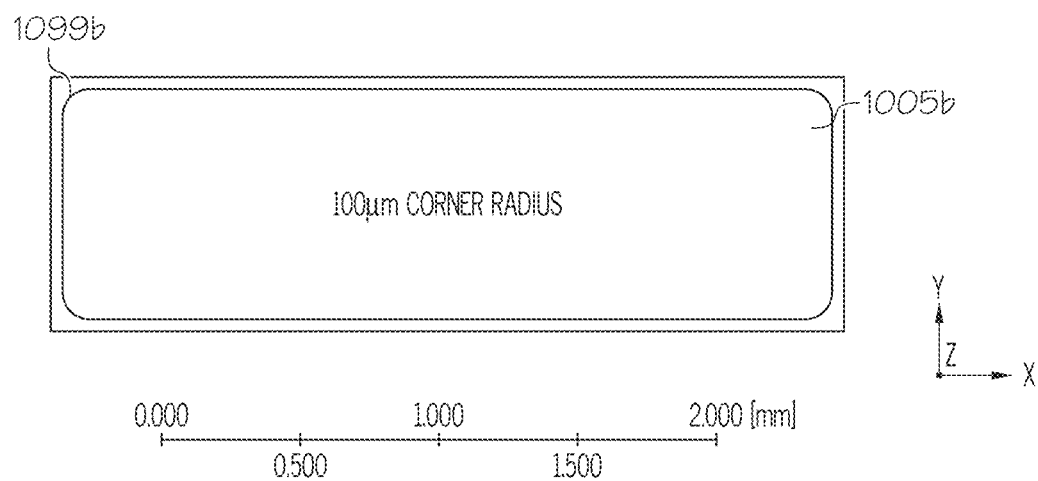
Figure 11A:
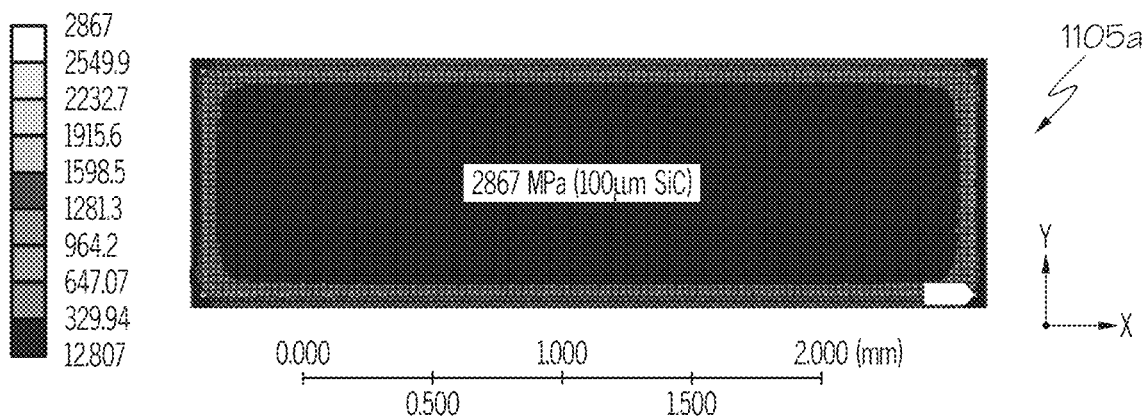
FIGS. 11A and 11B illustrate relative stress profiles for the bonding surfaces of FIGS. 10A and 10B, respectively.
Figure 11B:
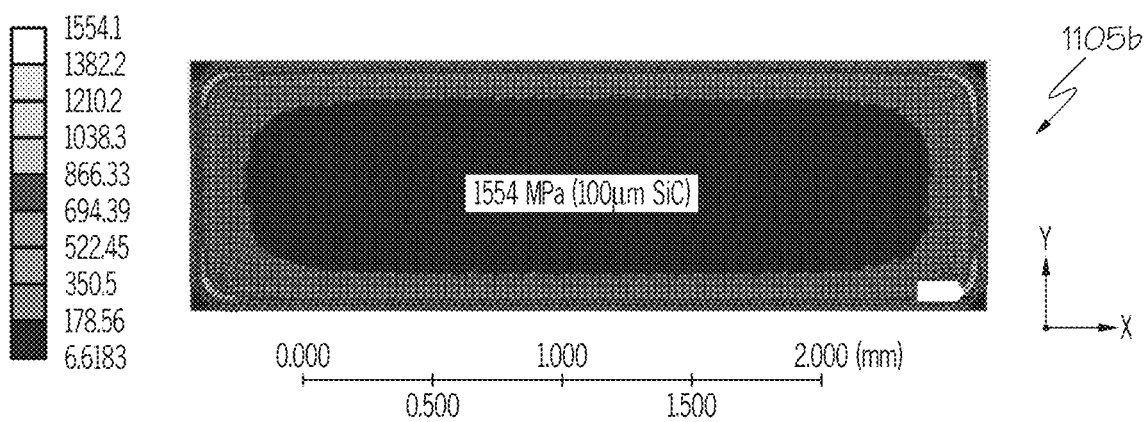

FIG. 10A illustrates a conventional bonding surface 1005a having orthogonal corners 1099a and FIG. 10B illustrates an example bonding surface 1005b provided by a backside metallization layer having radiused corners 1099b with a corner radius of about 100 microns in accordance with some embodiments of the present disclosure. FIGS. 11A and 11B illustrate relative stress profiles 1105a and 1105b for the bonding surfaces 1005a and 1005b of FIGS. 10A and 10B, respectively. The bond surfaces and stress profiles described with reference to FIGS. 10A-11B were obtained from thermo-mechanical stress simulations modeled for a 100 micron-thick SiC die, coated with a 6 micron-thick gold layer as the backside metallization, and having a 3 micron-thick layer of AuSn solder as the die attach material.

As shown in FIGS. 10A and 11A, the stress profile 1105a again indicates that maximum stress occurs at the corners 1099a of the bonding surface 1005a, with significantly reduction in stress towards the center of the bonding surface 1005a. In FIGS. 10B and 11B, while the stress profile 1105b still indicates maximum stress at the corners 1099b of the bonding surface 1005b, the corners 1099b having a radius of curvature of about 100 microns may reduce the maximum stress by about 50% (and may provide a greater distribution or reduced concentration of the stress along the perimeter of the bonding surface 1005b) as compared to the bonding surface 1005a having orthogonal corners. Accordingly, comparison of the stress profiles 1105a and 1105b of FIGS. 11A and 11B illustrates a bonding surface corner radius effect in accordance with embodiments of the present disclosure, where rounding or chamfering the corners of the bonding surface can significantly reduce interfacial stress between the bonding surface and the die attach material (e.g., at the interface between the Au metallization and the AuSn die attach material). Also, increasing the corner radius or chamfer dimension can increase the distribution of stress over the bonding surface.

Figure 11C:
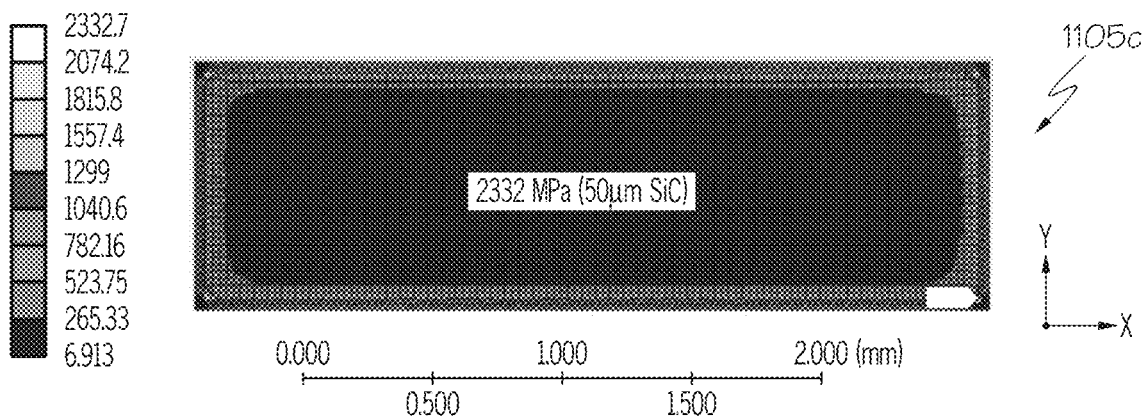
FIG. 11C illustrates a stress profile for the bonding surface of FIG. 10A on a die having a reduced thickness.

FIG. 11C further illustrates effects of the die thickness on the interfacial stress between the bonding surface and the die attach material. In particular, FIG. 11C illustrates a stress profile 1105c for the bonding surface 1005a of FIG. 10A having orthogonal corners, but on a SiC die having a thickness of 50 microns. As shown in the stress profile 1105c, the 50 micron-thick SiC die provides a stress reduction (in terms of both magnitude and concentration over the bonding surface 1005b) as compared to the bonding surface 1005a, but not as much of a stress reduction (in magnitude and concentration) as when the bonding surface 1005b is provided on the 100-micron-thick die having the 100-micron radiused corners. That is, while dies formed of higher-elastic modulus materials may shift stress from the die to the bond interface, the thickness of the die may significantly contribute to the magnitude and concentration of stress (e.g., from CTE mismatch) that is present at the bond interface (i.e., as die thickness is reduced, concentration and magnitude of stress at the bond interface is reduced).

Accordingly, bonding surfaces having non-orthogonal (e.g., radiused- or chamfered) corners in accordance with embodiments of the present disclosure can reduce stress at the corners of the bond area such that the bonding layer is better able to resist delamination of the semiconductor die from the substrate, even as die thickness is reduced. Embodiments described herein may be of particular benefit in die applications where delamination (rather than cracking or chipping) may be problematic, for example, for higher-elastic modulus semiconductor die materials (such as SiC or GaN on SiC dies) having reduced die thicknesses (for instance, less than about 100 microns or less than about 50 microns thick).

Bonding surfaces having non-orthogonal corners as described herein may be particularly resistant to delamination under exposure to extreme high and low temperatures, for example, under thermal shock and/or temperature cycle testing at temperatures ranging from temperatures between about −65° C. to about 150° C., and in some instances up to 500° C. Such thermal shock and/or temperature cycle testing may include temperature soak times, number of temperature cycles, and/or transfer times (from low-to-high and/or high-to-low temperatures) in accordance with JEDEC thermal shock and/or temperature cycling standards. For example, the temperature soak times may range from about 1 minute to about 15 minutes, the temperature cycles may range from about 5 cycles to several hundreds of cycles, and/or the transfer times may range from about 10 seconds or less to about 20 seconds.

In the various embodiments described above, the stress reduction in the bonding layer has been primarily described with respect to the backside of the die. However, it will be understood that bonding surfaces having non-orthogonal corners in accordance with embodiments described herein may similarly be applied for attachment on the front side of the die, for example, in applications involving the stacking of die.

Particular embodiments described herein may be directed to structures and related fabrication operations to provide rounded or chamfered corners of a backside metal layer, rounded or chamfered corners of a backside metal layer on a SiC die, and rounded or chamfered corners of a backside metal layer on a Si die. Advantages of rounded or chamfered corners may include a reduction in stress at the bond area where delamination typically initiates, which may improve reliability and/or compliance with thermal shock/temperature cycle testing requirements. The use of Si die (e.g., a GaN on Si die), instead of a SiC die, may further reduce stress. Embodiments described herein may be applied to die attachment of any high-elastic modulus dies, and may be particularly useful in RF applications, such as general, military, and/or telecommunication RF applications.

Figure 12A:
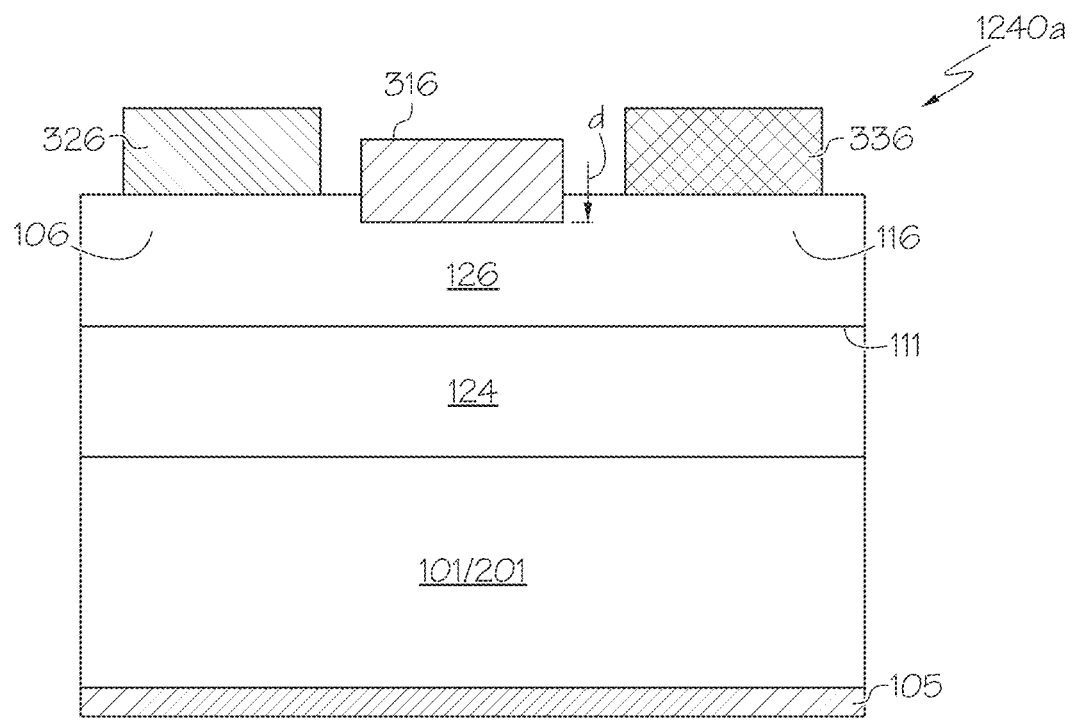
FIG. 12A is a cross-sectional view of a high-electron-mobility transistor (HEMT) cell structure on a semiconductor die in accordance with some embodiments of the present disclosure.

FIG. 12A is a cross-sectional view illustrating implementation of a high-electron-mobility transistor (HEMT) cell structure 1240a on a high-elastic modulus semiconductor die in accordance with some embodiments of the present disclosure. As shown in FIG. 12A, a HEMT transistor cell 1240a may include a semiconductor die 101/201, which may, for example, include Si, SiC, or other high-elastic modulus (e.g., E>100 GPa) material, and a metal bonding layer 105 on a surface thereof. An epitaxial structure is formed on the die 101/201. The epitaxial structure may include a channel layer 124 that is formed on the die 101/201, and a barrier layer 126 that is formed on the channel layer 124. The channel layer 124 and the barrier layer 126 may include Group III-nitride based materials, with the material of the barrier layer 126 having a higher bandgap than the material of the channel layer 124. For example, the channel layer 124 may comprise GaN, while the barrier layer 126 may comprise AlGaN. While the channel layer 124 and the barrier layer 126 are illustrated as single layer structures, it will be appreciated that either or both the channel layer 124 and/or the barrier layer 126 may be implemented as multi-layer structures. It will also be appreciated that additional layers such as, for example, buffer layers, strain-balancing layers, transition layers and the like may also be included as part of the epitaxial structure provided on the semiconductor die 101/201.

Due to the difference in bandgap between the materials of barrier layer 126 and the channel layer 124 and piezoelectric effects at the interface between the barrier layer 126 and the channel layer 124 (e.g., channel region 111), a two dimensional electron gas (2DEG) is induced in the channel layer 124 at a junction between the channel layer 124 and the barrier layer 126. The 2DEG acts as a highly conductive layer that allows conduction between the source region 106 and drain region 116 of the device that are beneath a source contact 326 and a drain contact 336, respectively. The source contact 326 and the drain contact 336 are formed on the barrier layer 126. A gate contact 316 is formed on the barrier layer 126 between the drain contact 336 and the source contact 326.

Figure 12B:
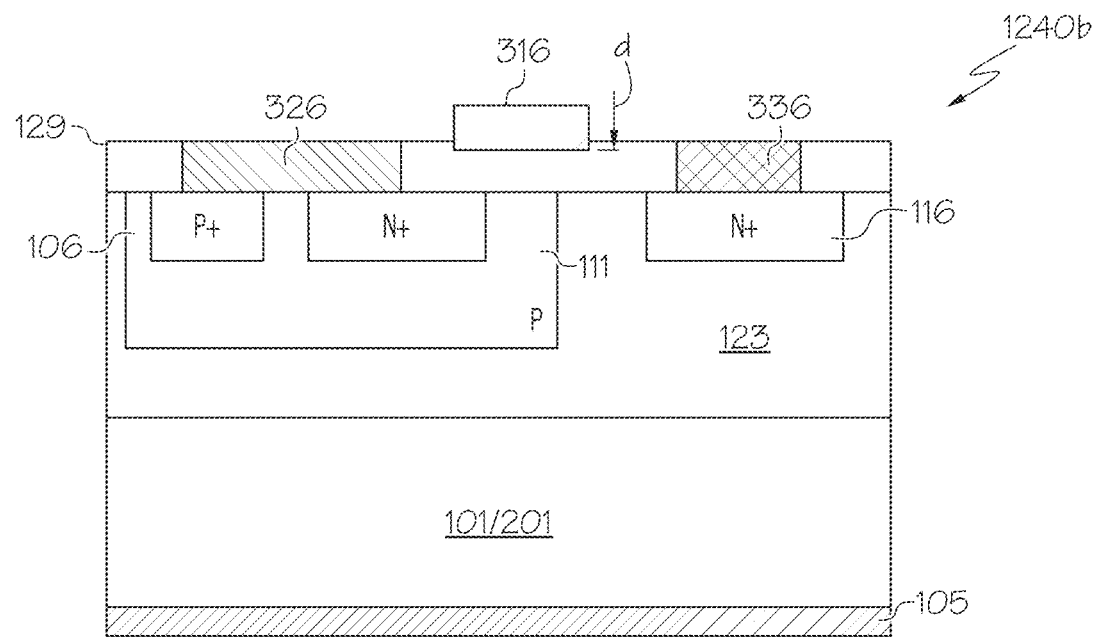
FIG. 12B is a cross-sectional view of a laterally diffused metal oxide semiconductor (LDMOS) transistor device cell structure on a semiconductor die in accordance with some embodiments of the present disclosure.

FIG. 12B is a cross-sectional view illustrating implementation of a metal-oxide-semiconductor field effect transistor (MOSFET) cell, in particular, a laterally diffused metal oxide semiconductor (LDMOS) transistor device cell structure 1240b on a high-elastic modulus semiconductor die in accordance with some embodiments of the present disclosure. The LDMOS is a 3-terminal transistor device that has a source region 106, a channel region 111, and a drain region 116 that are formed in or on a semiconductor die 101/201.

The semiconductor die 101/201 may, for example, include Si, SiC, or other high-elastic modulus (e.g., E>100 GPa) material, and a metal bonding layer 105 on a surface thereof. The semiconductor die 101/201 may provide a substrate (e.g., of p-type conductivity) and a drift layer 123 (e.g., of n-type conductivity) thereon. The LDMOS transistor cell 1240b may include doped well regions providing the source region 106 and drain region 116. The source region 106, drain region 116, and channel region 111 of the LDMOS transistor cell 1240b may be coupled to contacts for operation of the LDMOS transistor cell. For example, the channel region 111 may be electrically coupled to the gate contact 316, drain region 116 may be electrically coupled to the drain contact 336, and source region 106 may be electrically coupled to source contact 326. The channel region 111 is isolated from the gate contact 316 by an insulator layer 129 (e.g., $SiO_2$). Applying a positive voltage to the channel region 111 with respect to the source region 106 may provide for a current to flow between drain region 116 and the source region 106 by forming an inversion layer (e.g., a channel) between the source region 106 and the drain region 116. LDMOS FETs may operate in "enhancement mode," meaning the drain-source current may not flow until an applied positive gate voltage enhances a channel between the drain region 116 and the source region 106.

Though FIGS. 12A and 12B illustrate transistor structures with a contact 326 connected to an upper surface of the source region 106, it will be understood that other embodiments are possible. For example, in some embodiments, vias or other connection regions may be provided to connect the source region 106 and/or other regions to the metal contact layer 105 on the bottom surface of the devices 1240a, 1240b. The HEMT and LDMOS devices of FIGS. 12A and 12B are included as examples for possible configurations of a transistor unit cell, but it will be understood that other transistor cell configurations could be utilized in die attachment of high elastic modulus semiconductor dies as described herein without deviating from the scope of embodiments of the present disclosure. As such, the present invention is not limited to HEMT and LDMOS transistor cells.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. A semiconductor device package, comprising:
   a substrate;
   a semiconductor die comprising silicon (Si), silicon carbide (SiC), or diamond; and
   a metal layer on a surface of the semiconductor die, the metal layer comprising a bonding surface that is attached to a surface of the substrate, wherein, in plan view, the bonding surface comprises opposing edges that extend along a perimeter of the semiconductor die and one or more non-orthogonal corners.

2. The semiconductor device package of claim 1, wherein the one or more non-orthogonal corners comprise radiused or chamfered corners.

3. The semiconductor device package of claim 2, wherein the radiused or chamfered corners have a radius of curvature or chamfer dimension, respectively, of about 100 microns or more.

4. The semiconductor device package of claim 1, wherein the bonding surface is attached to the surface of the substrate by a die attach material, and wherein the one or more non-orthogonal corners are configured to reduce stress at an interface between the bonding surface and the die attach material.

5. The semiconductor device package of claim 4, wherein an elastic modulus of the semiconductor die is greater than that of the die attach material by about 1.5 times or more.

6. The semiconductor device package of claim 4, wherein a thickness of the semiconductor die is less than about 100 microns, wherein a thickness of the metal layer is less than about 10 microns, and wherein a thickness of the die attach material is less than the thickness of metal layer.

7. The semiconductor device package of claim 4, wherein the metal layer and/or the die attach material comprise gold (Au) or an alloy thereof, and wherein the surface of the substrate comprises a die attach pad comprising copper (Cu) or an alloy or composite thereof.

8. The semiconductor device package of claim 2, wherein the surface of the semiconductor die including the metal layer thereon comprises radiused or chamfered corners that are aligned with the radiused or chamfered corners of the bonding surface.

9. The semiconductor device package of claim 8, wherein opposing edges and the radiused or chamfered corners of the semiconductor die comprise laser-ablated edges and corners, respectively.

10. The semiconductor device package of claim 1, wherein the bonding surface comprises a substantially planar surface extending in first and second directions, and the one or more non-orthogonal corners are radiused or chamfered in the first and second directions.

11. The semiconductor device package of claim 3, wherein the radius of curvature or chamfer dimension is about 100 microns to about 200 microns, or about 200 microns to about 300 microns.

12. A semiconductor device package, comprising:
   a substrate;
   a semiconductor die comprising silicon (Si), silicon carbide (SiC), or diamond; and
   a metal layer on a surface of the semiconductor die, the metal layer comprising a bonding surface that is attached to a surface of the substrate, the bonding surface comprising opposing edges that extend along a perimeter of the semiconductor die and one or more non-orthogonal corners,
   wherein the opposing edges of the bonding surface extend along the perimeter of the semiconductor die at a distance of less than 25 microns therefrom, and wherein the perimeter is defined by scribe lines that are free of the metal layer.

13. A semiconductor device package, comprising:
   a substrate;
   a die comprising a semiconductor material having an elastic modulus of greater than 100 gigapascals (GPa); and
   a metal layer on a surface of the die and comprising a bonding surface that is attached to a surface of the substrate, wherein, in plan view, the bonding surface comprises opposing edges that extend along a perimeter of the die and one or more radiused or chamfered corners.

14. The semiconductor device package of claim 13, wherein the one or more radiused or chamfered corners have a radius of curvature or chamfer dimension, respectively, of about 100 microns or more.

15. The semiconductor device package of claim 13, wherein the opposing edges of the bonding surface extend along the perimeter of the die at a distance of less than 25 microns therefrom.

16. The semiconductor device package of claim 13, wherein the bonding surface is attached to the surface of the substrate by a die attach material, and wherein the one or more radiused or chamfered corners are configured to reduce stress at an interface between the bonding surface and the die attach material.

17. The semiconductor device package of claim 16, wherein an elastic modulus of the semiconductor material is greater than that of the die attach material by about 1.5 times or more.

18. The semiconductor device package of claim 16, wherein the semiconductor material comprises silicon (Si) or gallium nitride (GaN), wherein the metal layer and/or the die attach material comprise gold (Au) or an alloy thereof, and wherein the surface of the substrate comprises a die attach pad comprising copper (Cu) or an alloy or composite thereof.

19. The semiconductor device package of claim 18, wherein the surface of the die including the metal layer thereon comprises radiused or chamfered corners that are aligned with the radiused or chamfered corners of the bonding surface.

20. The semiconductor device package of claim 19, wherein opposing edges and the radiused or chamfered corners of the die comprise laser-ablated edges and corners, respectively.

21. The semiconductor device package of claim 13, wherein the bonding surface comprises a substantially planar surface extending in first and second directions, and the radiused or chamfered corners are radiused or chamfered in the first and second directions.

22. The semiconductor device package of claim 14, wherein the radius of curvature or chamfer dimension is about 100 microns to about 200 microns, or about 200 microns to about 300 microns.

23. A semiconductor device package, comprising:
a substrate;
a die comprising a semiconductor material; and
a metal layer on a surface of the die and comprising a bonding surface having radiused or chamfered corners in plan view, wherein the bonding surface is attached to a surface of the substrate by a die attach material, and wherein an elastic modulus of the semiconductor material is greater that of the die attach material by about 1.5 times or more.

24. The semiconductor device package of claim 23, wherein the bonding surface comprises opposing edges that extend along a perimeter of the die at a distance of less than 25 microns therefrom.

25. The semiconductor device package of claim 24, wherein the radiused or chamfered corners have a radius of curvature or chamfer dimension, respectively, of about 100 microns or more.

26. The semiconductor device package of claim 25, wherein the radiused or chamfered corners are configured to reduce stress at an interface between the bonding surface and the die attach material.

27. The semiconductor device package of claim 26, wherein the surface of the die including the metal layer thereon comprises laser-ablated radiused or chamfered corners that are aligned with the radiused or chamfered corners of the bonding surface.

28. The semiconductor device package of claim 23, wherein the bonding surface comprises a substantially planar surface extending in first and second directions, and the radiused or chamfered corners are radiused or chamfered in the first and second directions.

29. The semiconductor device package of claim 25, wherein the radius of curvature or chamfer dimension is about 100 microns to about 200 microns, or about 200 microns to about 300 microns.

30. A semiconductor device package, comprising:
a substrate; and
a semiconductor die attached to a surface of the substrate, the semiconductor die comprising a material having an elastic modulus of greater than 100 gigapascals (GPa), wherein, in plan view, a surface of the semiconductor die adjacent the surface of the substrate comprises radiused or chamfered corners.

31. The semiconductor device package of claim 30, wherein the material comprises silicon (Si), silicon carbide (SiC), or diamond, and wherein the radiused or chamfered corners are laser-ablated.

32. The semiconductor device package of claim 30, further comprising:
a metal layer on the surface of the semiconductor die, the metal layer comprising a bonding surface having radiused or chamfered corners that are aligned with the radiused or chamfered corners of the surface of the semiconductor die.

33. The semiconductor device package of claim 30, wherein the surface of the semiconductor die comprises a substantially planar surface extending in first and second directions, and the radiused or chamfered corners are radiused or chamfered in the first and second directions.

* * * * *

UNITED STATES PATENT AND TRADEMARK OFFICE
CERTIFICATE OF CORRECTION

| | |
|---|---|
| PATENT NO. | : 11,488,923 B2 |
| APPLICATION NO. | : 16/421824 |
| DATED | : November 1, 2022 |
| INVENTOR(S) | : Joo et al. |

It is certified that error appears in the above-identified patent and that said Letters Patent is hereby corrected as shown below:

On the Title Page

(71) Applicant: Please correct "Cree, Inc." to read --Wolfspeed, Inc.--

In the Specification

Column 11, Line 2: Please correct "2010" to read --201*o*--

In the Claims

Column 21, Line 52, Claim 23: Please correct "is greater that" to read --is greater than that--

Signed and Sealed this
Eighteenth Day of April, 2023

Katherine Kelly Vidal
*Director of the United States Patent and Trademark Office*